(12) United States Patent
Miyazaki et al.

(10) Patent No.: US 6,861,747 B2
(45) Date of Patent: Mar. 1, 2005

(54) RADIATION TYPE BGA PACKAGE AND PRODUCTION METHOD THEREFOR

(75) Inventors: Takeshi Miyazaki, Sanda (JP); Akihiro Hamano, Ube (JP); Shigehisa Tomabechi, Onoda (JP)

(73) Assignee: Sumitomo Metal (SMI) Electronics Devices Inc., Mine (JP)

( * ) Notice: Subject to any disclaimer, the term of this patent is extended or adjusted under 35 U.S.C. 154(b) by 0 days.

(21) Appl. No.: 10/297,750

(22) PCT Filed: Apr. 8, 2002

(86) PCT No.: PCT/JP02/03530
§ 371 (c)(1),
(2), (4) Date: Dec. 9, 2002

(87) PCT Pub. No.: WO02/084733
PCT Pub. Date: Oct. 24, 2002

(65) Prior Publication Data
US 2004/0051172 A1 Mar. 18, 2004

(30) Foreign Application Priority Data

| Apr. 9, 2001 | (JP) | 2001-110045 |
| Aug. 16, 2001 | (JP) | 2001-247001 |
| Nov. 21, 2001 | (JP) | 2001-355928 |
| Dec. 5, 2001 | (JP) | 2001-370957 |
| Feb. 26, 2002 | (JP) | 2002-050061 |

(51) Int. Cl.[7] ............................................. H01L 23/34
(52) U.S. Cl. .................... 257/718; 257/726; 257/727
(58) Field of Search ........................ 257/718, 726–727, 257/706, 667, 698

(56) References Cited

FOREIGN PATENT DOCUMENTS

| EP | 0 554 893 | 8/1993 |
| JP | 1-125590 | 8/1989 |
| JP | 5-243429 | 9/1993 |
| JP | 5-343588 | 12/1993 |
| JP | 8-293569 | 11/1996 |
| JP | 11-150219 | 6/1999 |
| JP | 11-163230 | 6/1999 |
| JP | 11-340389 | 12/1999 |
| JP | 2001-035975 | 2/2001 |

*Primary Examiner*—Phat X. Cao
*Assistant Examiner*—Theresa T. Doan
(74) *Attorney, Agent, or Firm*—Burns, Doane, Swecker & Mathis, L.L.P.

(57) ABSTRACT

(1) A thermal enhanced type of BGA package, in which a metal heat sink is joined to one side of a plastic circuit board which has a cutout space in the central portion, comprised of a clamping member joining the plastic circuit board and the heat sink. A caulking member, a rivet, a screw, an eyelet, or a tubular rivet could be used as the clamping member. It is preferable that a dam member is definitely attached by the clamping member.

(2) Another thermal enhanced type of BGA package, in which a circuit pattern is provided in the plastic circuit board and the heat sink and/or the dam member are electrically connected to a part of the circuit pattern through the clamping member. It is preferable to use the clamping member coated by solder.

19 Claims, 26 Drawing Sheets

(sectional view taken along a line A-A)

(sectional view taken along a line B-B)

(sectional view taken along a line C-C)

(sectional view taken along a line D-D)

(sectional view taken along a line E-E)

(sectional view taken along a line F-F)

(sectional view taken along a line G-G)

(sectional view taken along a line H-H)

(sectional view taken along a line I-I)

(sectional view taken along a line J-J)

US 6,861,747 B2

RADIATION TYPE BGA PACKAGE AND PRODUCTION METHOD THEREFOR

FIELD OF THE INVENTION

The present invention relates to a thermal enhanced type of BGA package, having a heat sink on one side of a plastic circuit board and a cavity in the central portion, and the manufacturing method thereof.

BACKGROUND OF THE INVENTION

In recent years, demand for such high density, high speed and multi-terminals on a semiconductor package is increasing more and more with the high integration of a semiconductor chip, so that a BGA (Ball Grid Array) type of package is needed. The BGA package is a kind of a surface mount type of a package in which many contact terminals including solder balls are arrayed on the bottom surface. In order to cope with the increment of heat generation of the semiconductor chip due to high performance in recent years, a thermal enhanced type of BGA package having a cavity-down structure, equipped with a heat sink on a plastic circuit board, has been developed.

As shown in FIG. 1, a conventional thermal enhanced type of BGA package 1a, forms a cavity 5 in a manner that a heat sink 3, made of copper or copper alloys, is adhesively joined to a plastic circuit board 2, having a cutout space in its central portion, with a bonding agent 4, such as a prepreg and an adhesive by means of heating and pressurizing.

As shown in FIG. 2, in another conventional thermal enhanced type of BGA package 1b, an additional metal plate 6, having the same size in plan view as the plastic circuit board 2 and being made of copper or copper alloys, is provided between the plastic circuit board 2 and the heat sink 3. The plastic circuit board 2 and the metal plate 6, and the metal plate 6 and the heat sink 3, are adhesively joined with a bonding agent 4, such as the prepreg and an adhesive, by means of heating and pressurizing.

The thermal enhanced type of BGA packages are used for a semiconductor device in a manner that a semiconductor chip is die-bonded to the cavity 5, wire-bonded to the plastic circuit board, and sealed with sealing resin, and a solder ball is attached on a surface of the plastic circuit board.

A surface roughening process such as an oxidation treatment known as a black oxide treatment is applied to the bonding surface of the heat sink in order to increase adhesive strength, so that mechanical strength is increased by an anchor effect.

However, there are unsolved problems of these thermal enhanced type of BGA packages which are as follows:

(I) The adhesive strength could be decreased by a void trapped in the bonding agent or uneven thickness of the adhesive agent layer.

(II) Since the bonding is accomplished by heating and pressurizing the bonding agent, the bonding agent could run into the cavity, so that yield is reduced.

(III) When a solder resist film is formed by charging the resin into a through hole formed in the plastic circuit board, moisture taken into the resin or the bonding agent loses all means of escape between the heat sink due to the heating of reflow soldering. Then, because it generates a so-called popcorn phenomenon, the thermal enhanced type of BGA package could be destroyed.

(IV) It is important to take action against noise generated in the package or noise coming from outside of the package, due to increase a clock frequency in recent years. However, in the conventional thermal enhanced type of BGA packages, any preventive action against the noise in the heat sink is not taken.

SUMMARY OF THE INVENTION

Purposes of the invention are as follows:

It is the first purpose of the invention to provide a thermal enhanced type of BGA package to which a plastic circuit board and a heat sink are mechanically joined without the use of a bonding agent such as a prepreg.

It is the second purpose of the invention to provide a thermal enhanced type of BGA package to which a plastic circuit board and a heat sink are mechanically joined and preventive measures against noise are taken.

It is the third purpose of the invention to provide a manufacturing method of the thermal enhanced type of BGA package described in the first purpose of the invention.

It is the fourth purpose of the invention to provide a manufacturing method of the thermal enhanced type of BGA package described in the second purpose of the invention.

The invention includes the thermal enhanced type of BGA packages of (i) and (ii) and manufacturing methods of (iii) to (vi):

(i) A thermal enhanced type of BGA package, in which a metal heat sink is joined to one side of a plastic circuit board which has a cutout space in the central portion, which is comprised of a damping member joining the plastic circuit board and the heat sink. Hereafter, the invention according to this package is referred to as "the first invention".

A caulking member, a rivet, a screw, an eyelet, and a tubular rivet could be use as the clamping member. If the caulking member, the rivet, or the screw is used, the clamping member may be formed with the integrated heat sink. It is desirable that the thermal enhanced type of BGA package according to the invention has a dam member fixed by the clamping member.

(ii) A thermal enhanced type of BGA package in which a metal heat sink is joined to one side of the plastic circuit board, having a cutout space in the central portion, which is comprised of a damping member joining the plastic circuit board and the heat sink; wherein a circuit pattern is provided in the plastic circuit board and the heat sink is electrically connected with a part of the circuit pattern through the clamping member. Hereafter, the invention according to this package is referred to as "the second invention".

It is desirable that the thermal enhanced type of BGA package in (ii) has a dam member attached by the clamping member and this dam member and the heat sink are electrically connected to a part of the circuit pattern, through the damping member. It is desirable that the clamping member is joined by solder to the plastic circuit board and the heat sink, or the plastic circuit board, the heat sink and the dam member.

A caulking member, a rivet, a screw, an eyelet, and a tubular rivet could be use as the clamping member.

By mounting a semiconductor chip on the thermal enhanced type of BGA package, described in (i) or (ii), a semiconductor device which the problems described in (I) to (IV) can be solved and manufacturing can be accomplished.

(iii) A manufacturing method of the thermal enhanced type of BGA package of the first invention, and the manufacturing method of the thermal enhanced type of BGA package, in which a metal heat sink is joined to one side of a plastic circuit board, having a cutout space in the central portion by an eyelet, having a shape of a sword guard at one end, comprised of the following steps;
(1) preparing an alignment jig in which one or more guide pins, having a smaller outer diameter than an inner diameter of a hollow portion of the eyelet, are provided perpendicularly at certain positions on the support mount,
(2) placing the eyelet on the alignment jig so that the guide pin may be inserted into the eyelet,
(3) providing a through hole, having the substantially same diameter as the outer diameter of a cylindrical portion of the eyelet, at certain positions in the plastic circuit board and the heat sink,
(4) thrusting the plastic circuit board and the heat sink so that the eyelet, placed on the alignment jig, may be inserted in to through holes of the plastic circuit board and the heat sink, and
(5) joining the plastic circuit board and the heat sink in such a way as to depress an end of the eyelet by a pushing member.

In the manufacturing method of the thermal enhanced type of BGA package shown in (iii), it is desirable that the manufacturing method is comprised of following steps:
thrusting a dam member, in which a through hole, having substantially the same diameter as an outer diameter of a columnar portion of the eyelet, is provided at a certain position, with the plastic circuit board and the heat sink, so that the eyelet placed on the alignment jig may be inserted into the through holes of the dam member, the plastic circuit board, and the heat sink; and
joining the plastic circuit board, the heat sink, and the dam member in such a way as to depress the end of the eyelet by the pushing member.

In the alignment jig, a guide pin which is movable both upward and downward, is provided perpendicularly at a certain position on the support mount, and the guide pin is moved downward following the depression of the eyelet.

(iv) A manufacturing method of the thermal enhanced type of BGA package of the first invention, and the manufacturing method of the thermal enhanced type of BGA package, in which a metal heat sink is joined to one side of a plastic circuit board, having a cutout space in the central portion, by a tubular rivet comprised of the following steps;
(1) preparing an alignment jig in which one or more guide pins, having substantially the same outer diameter as a cylindrical portion of the tubular rivet, are provided perpendicularly at certain positions on a support mount in order to move upward and downward,
(2) providing through holes, having substantially the same diameter as the outer diameter of a cylindrical portion of the tubular rivet, at certain positions on the plastic circuit board and the heat sink,
(3) placing the plastic circuit board and the heat sink on the alignment jig, by thrusting the plastic circuit board and the heat sink so that the guide pin may be inserted into the through holes of the plastic circuit board and the heat sink,
(4) depressing the end of the tubular rivet with the hollow shaped end surface of the tubular rivet abutted to the upper end surface of the guide pin and inserting the tubular rivet into the through holes of the plastic circuit board and the heat sink, when the guide pin is moved downward, and
(5) joining the plastic circuit board and the heat sink in a manner that the downward movement of the guide pin is stopped with its upper portion projected from the support mount, while the sword guard shaped end of the tubular rivet is further depressed, and the hollow shaped end of the tubular rivet is expanded outward from the central axis.

In the manufacturing method of the thermal enhanced type of BGA package shown in (iv), it is desirable that the manufacturing method is comprised of following steps:
thrusting a dam member in which a through hole, having substantially the same diameter as the outer diameter of the cylindrical portion of the tubular rivet is provided at a certain position, with the plastic circuit board and the heat sink, so that the guide pin may be inserted into the through holes of the dam member, the plastic circuit board, and the heat sink; and
joining the plastic circuit board, the heat sink, and the dam member in such a way as to depress the sword guard shaped end of the tubular rivet.

It is preferable to use the guide pin which has a chamfer portion in the upper area and this guide pin is perpendicularly provided at the alignment jig, and the hollow shaped end of the tubular rivet is depressed to expand outward from the central axis by the chamfer portion. It is desirable that the hollow shaped end of the tubular rivet is depressed into a counter bore portion provided in an outer periphery portion of a bottom side of the through hole in the heat sink.

(v) A manufacturing method of the thermal enhanced type of BGA package of the first invention, and the manufacturing method of the thermal enhanced type of BGA package in which a metal heat sink is joined by a tubular rivet to one side of a plastic circuit board, having a cutout space in the central portion, is comprised of the following steps;
(1) providing a through holes, having substantially the same diameter as an outer diameter of a cylindrical portion of the tubular rivet, at certain positions of the plastic circuit board and the heat sink,
(2) placing the plastic circuit board on the heat sink in a manner that the hollow shaped end of the tubular rivet is inserted from a bottom side of the heat sink into the through hole provided in the heat sink and into the through hole provided in the plastic circuit board, and
(3) joining the plastic circuit board and the heat sink by depressing the hollow shaped end of the tubular rivet to expand outward from the central axis.

In the manufacturing method of the thermal enhanced type of BGA package shown in (v) above, it is preferable that the manufacturing method is comprised of following steps:
thrusting a dam member, in which a through hole, having substantially the same diameter as the outer diameter of a cylindrical portion of the tubular rivet, is provided at a certain position, with the plastic circuit board and the heat sink, so that the tubular rivet may be inserted into the through holes of the dam member, the plastic circuit board, and the heat sink; and
joining the plastic circuit board, the heat sink, and the dam member by depressing the end of the tubular rivet.

It is desirable that the sword guard shaped end of the tubular rivet is placed in a counter bore portion which is provided in the outer periphery portion of a bottom side of the through hole in the heat sink.

(vi) A manufacturing method of the thermal enhanced type of BGA package of the second invention, and the manufacturing method of the thermal enhanced type of BGA package, in which a metal heat sink is joined by a rivet to one side of a plastic circuit board, having a cutout space in the central portion, is comprised of the following steps;
(1) providing a circuit pattern in the plastic circuit board,
(2) providing through holes at certain positions of the plastic circuit board and the heat sink,
(3) treating the through-hole plating to the through hole, provided in the plastic circuit board, to form a metal plating film, and connecting the metal plating film electrically to a part of the circuit pattern provided in the plastic circuit board, (4) joining the plastic circuit board and the heat sink in a manner that the rivet, coated by solder, is inserted into the through holes provided in the plastic circuit board and the heat sink to depress the rivet, and (5) connecting the rivet electrically to a part of the circuit pattern provided in the plastic circuit board through the metal plating film and the solder, while the plastic circuit board and the heat sink are joined by the rivet in a manner in which the solder is melted by heating the plastic circuit board and the heat sink.

In the manufacturing method of the thermal enhanced type of BGA package shown in (vi) above, it is desirable that the manufacturing method includes the step of joining a dam member, whose through hole is provided at a certain position, to the plastic circuit board and the heat sink, by the rivet. A screw, an eyelet, and a tubular rivet is used instead of the rivet.

BRIEF DESCRIPTION OF THE DRAWINGS

FIG. 6(a) shows a plan view and FIG. 6(b) shows a cross-sectional view taken on a broken line in FIG. 6(a);

FIG. 7(a) shows a plan view and FIG. 7(b) shows a cross-sectional view taken on a broken line in FIG. 7(a);

FIG. 12(a) shows a plan view and FIG. 12(b) shows a cross-sectional view taken on a broken line in FIG. 12(a);

FIG. 13(a) shows a plan view and FIG. 13(b) shows a cross-sectional view taken on a broken line in FIG. 13(a);

FIG. 14(a) shows a plan view and FIG. 14(b) shows a cross-sectional view taken on a broken line in FIG. 14(a);

FIG. 16(a) shows a case where a screw is used for a clamping member, FIG. 16(b) shows a case where a an eyelet is used for a clamping member, and FIG. 16(c) shows a case where a tubular rivet is used for a clamping member;

FIG. 19(a) to FIG. 19(d) shows a state of each member at each step;

FIG. 22(a) to FIG. 22(d) shows a state of each member at each step;

FIG. 27(a) to FIG. 27(d) shows a state of each member at each step.

DESCRIPTION OF THE PREFERRED EMBODIMENTS

A. A Thermal Enhanced Type of BGA Package According to the First Invention

Figure 1:
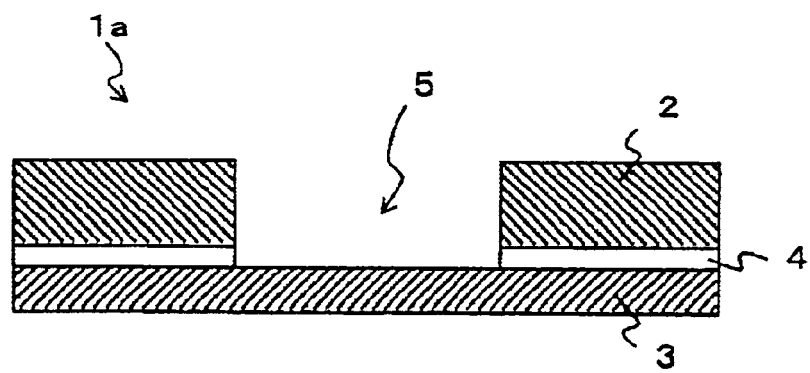
FIG. 1 and FIG. 2 show a conventional thermal enhanced type of BGA package.
Figure 2:
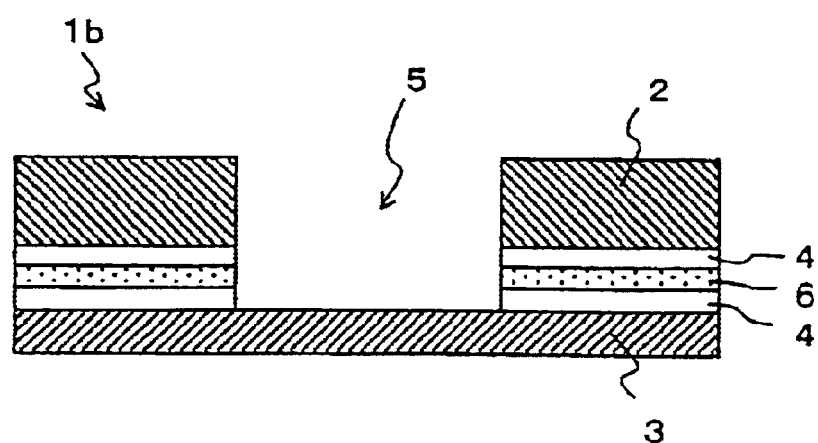
Figure 3:
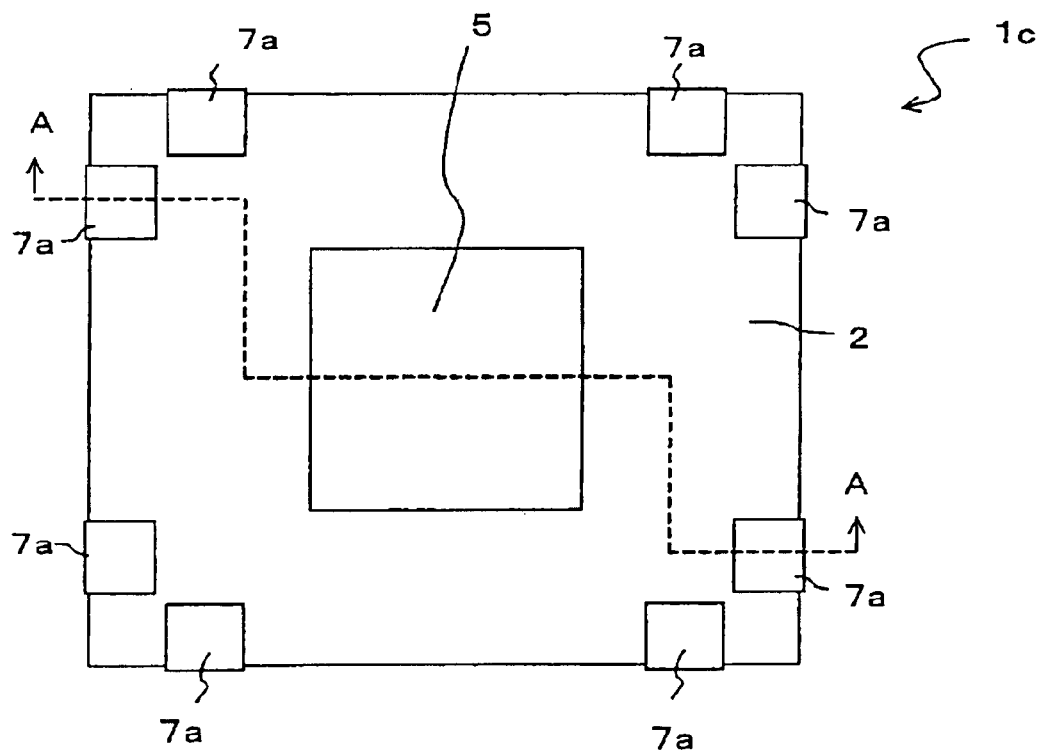
FIGS. 3 to 5 show an example of a thermal enhanced type of BGA package according to the first invention in which a caulking member is used for a clamping member. In each figure, figure (a) shows a plan view and figure (b) shows a cross-sectional view taken on a broken line in figure (a)
Figure 3:
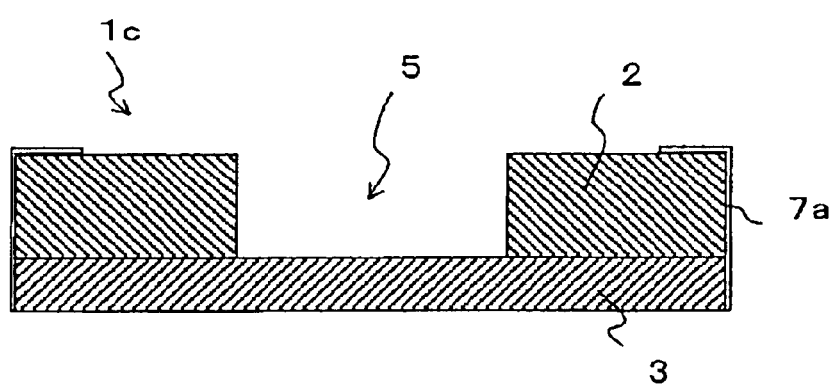
Figure 4:
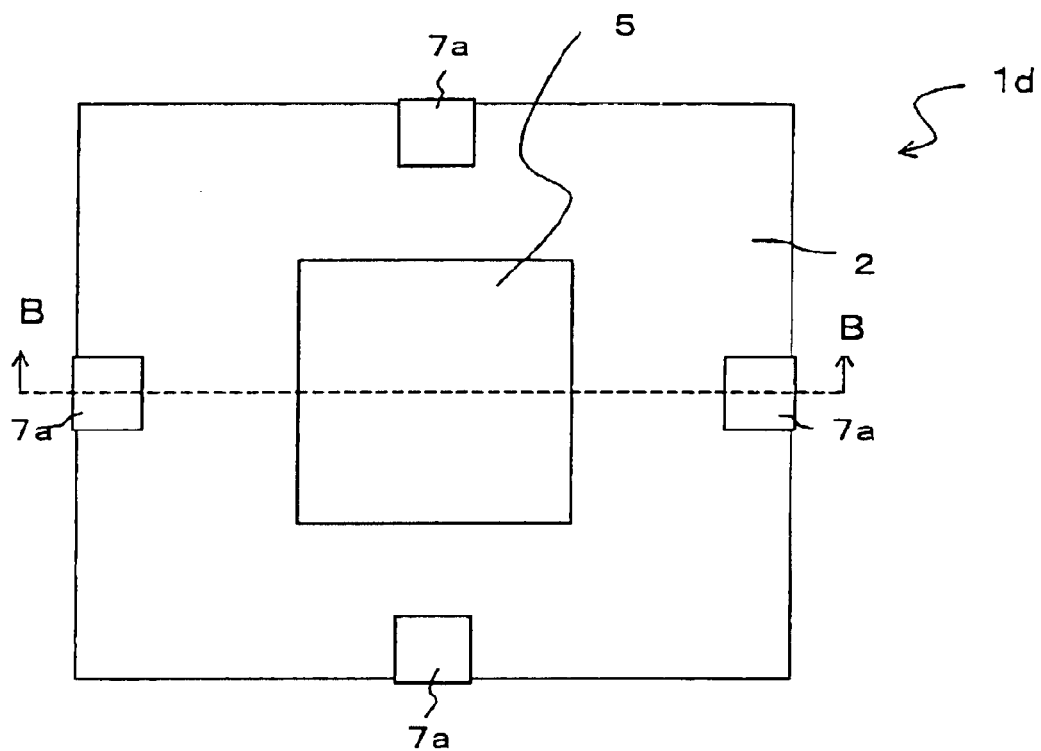
Figure 4:
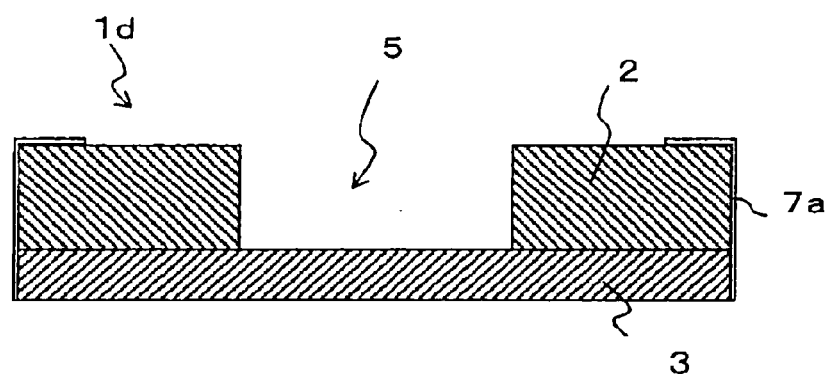
Figure 5:
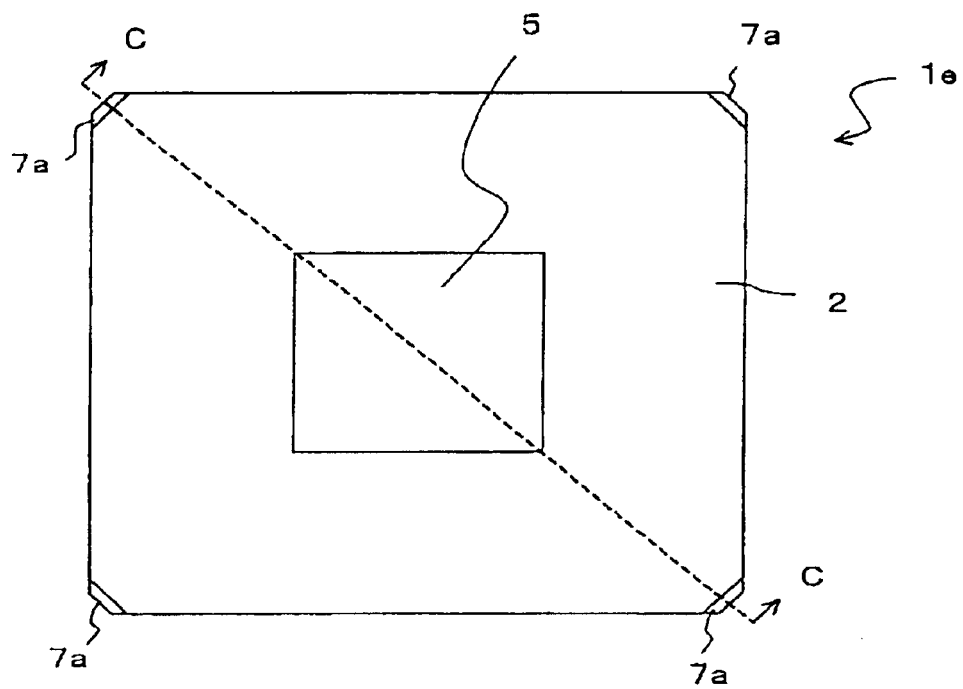
Figure 5:
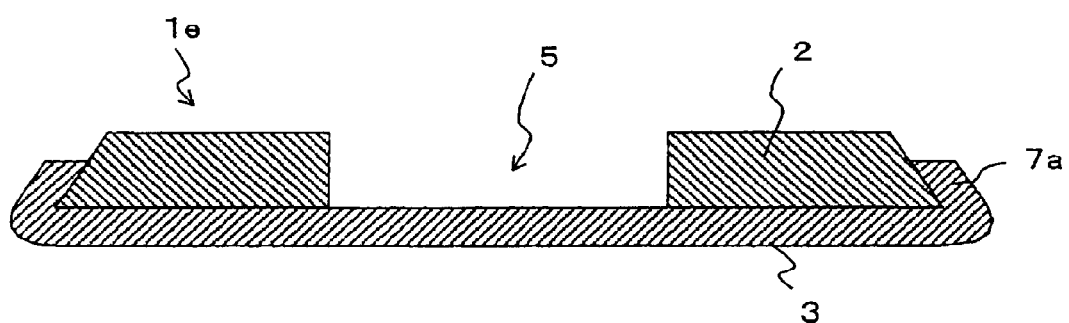
Figure 6:
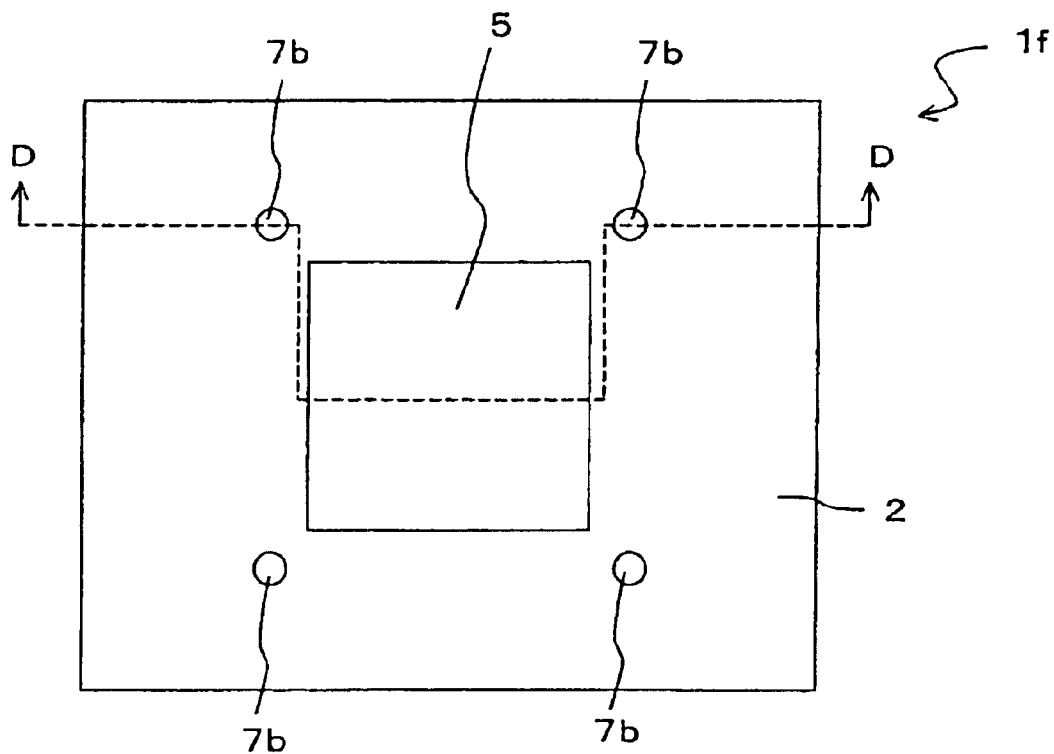
FIG. 6 shows an example of a thermal enhanced type of BGA package according to the first invention in which a rivet is used for a clamping member.
Figure 6:
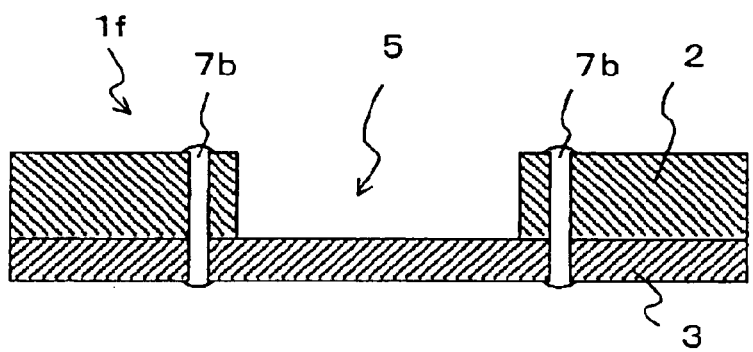
Figure 7:
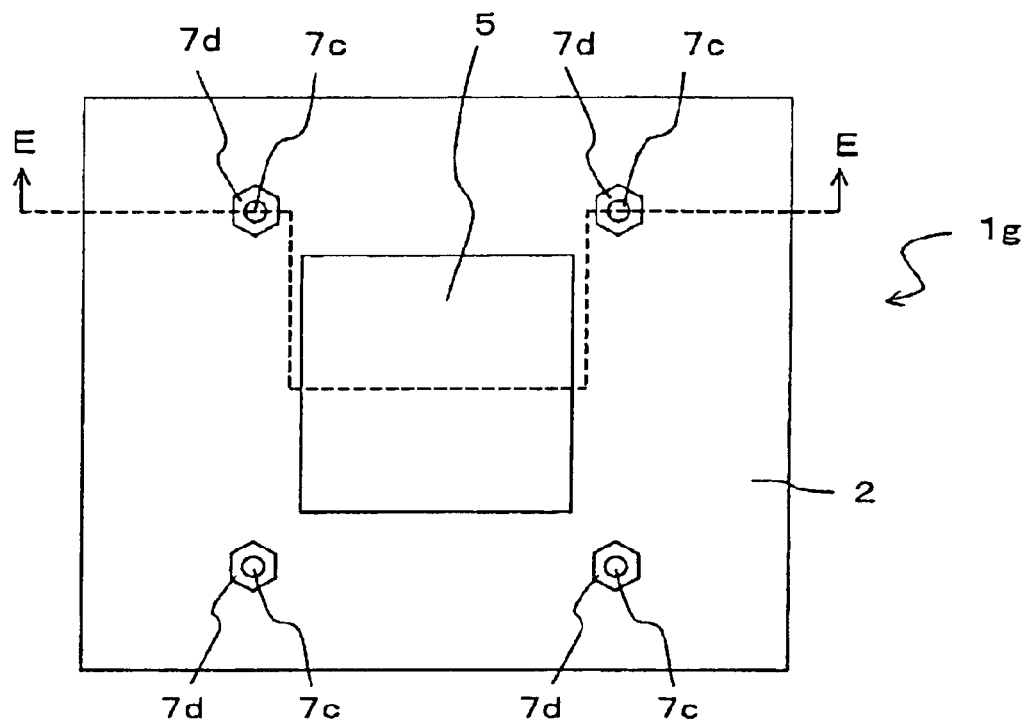
FIG. 7 shows an example of a thermal enhanced type of BGA package according to the first invention in which a screw is used for a clamping member.
Figure 7:
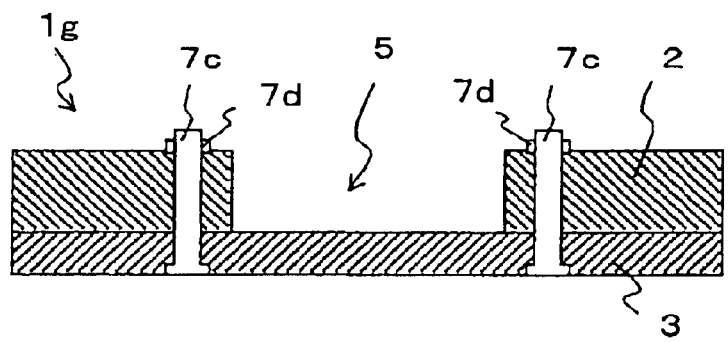

FIGS. 3 to 7 show examples of a thermal enhanced type of BGA package according to the first invention, FIGS. 3 to 5 show examples whose damping member is a caulking member, FIG. 6 shows an example whose clamping member is a rivet, and FIG. 7 shows an example whose clamping member is a screw and a nut. In each figure, figure (a) shows a plan view, figure (b) shows a cross-sectional view taken on a broken line in figure (a).

As shown in FIG. 3, in a thermal enhanced type of BGA package 1c, according to the first invention, a plastic circuit board 2 is connected to a heat sink 3 by a caulking member 7a. A cavity 5 is formed by the plastic circuit board 2 having a cutout space in the central portion and an exposed surface of the heat sink 3. The caulking member 7a, which is provided on the edge portion of the heat sink 3 by integrated molding or welding, is superimposed on the plastic circuit board 2 and the heat sink 3 and then folded to firmly join the plastic circuit board 2 and the heat sink 3.

Installation positions of the caulking member 7a are not limited to the positions shown in FIG. 3. For example, as shown in FIG. 4, the caulking member 7a may be also provided in the central portion of each side of the plastic circuit board 2. As shown in FIG. 5, the caulking member 7a may be also provided in each corner of the plastic circuit board 2. In this case, as shown in FIG. 5(b), it is recommended that the plastic circuit board 2 which corners are cut slantingly and formed in a taper shape (notch forming) is used. The plastic circuit board 2, having a slanting cut corners, can firm the joining of the caulking member 7a. A taper machining may be used on all the edges of the plastic circuit board 2.

FIG. 6 shows an example in which a rivet is used for the clamping member. As shown in FIG. 6, a thermal enhanced type of BGA package if, according to the first invention, has a structure in which the plastic circuit board 2 and the heat sink 3 are firmly joined, for example, in a manner that a rivet 7b is inserted into through hole provided in the plastic circuit board 2 and the heat sink 3 and both ends of the rivet 7b are pressed by a pressing machine, not shown in FIG. 6. In this case the plastic circuit board 2 and the heat sink 3 are joined by a rivet and the caulking members shown in FIGS. 3 to 5 may be used together in order to obtain higher joining strength.

FIG. 7 shows an example in which a screw and a nut are used as the clamping member. As shown in FIG. 7, in a thermal enhanced type of BGA package 1g, according to the first invention, the plastic circuit board 2 and the heat sink 3 are joined by a screw 7c and a nut 7d instead of the rivet. In this case, the clamping members, such as the caulking members and the rivet, may be also used with the screw to join the plastic circuit board 2 and the heat sink 3.

The caulking member, the rivet, and the screw may be integrally molded with the heat sink as described below.

Figure 8:
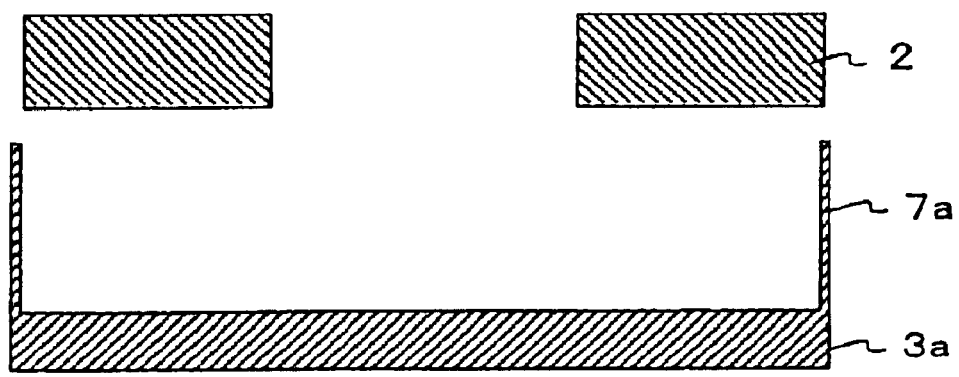
FIGS. 8 to 10 show a case where a plastic circuit board and a heat sink are joined by using an integrally molded caulking member, a rivet, and a screw respectively.
Figure 8:
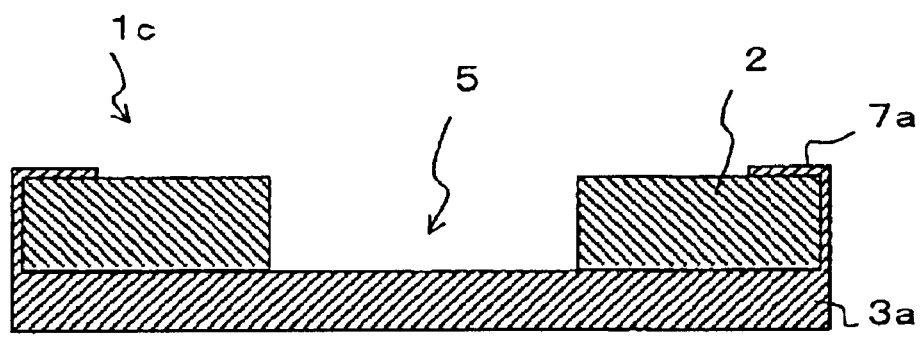
Figure 9:
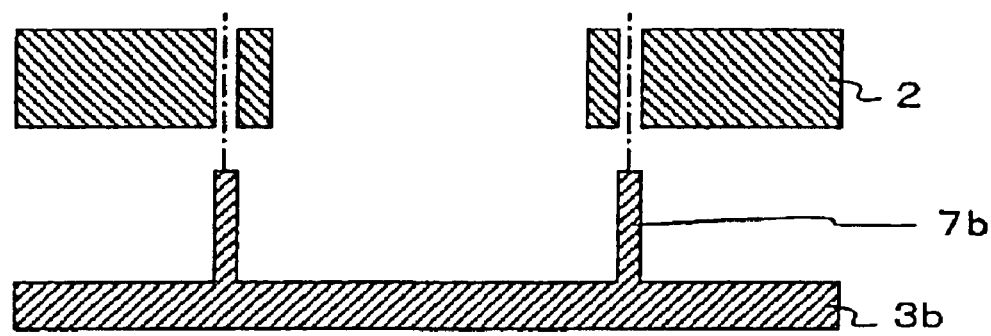
Figure 9:
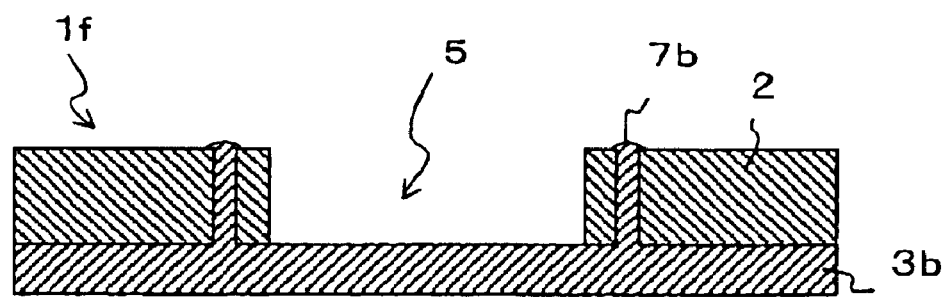
Figure 10:
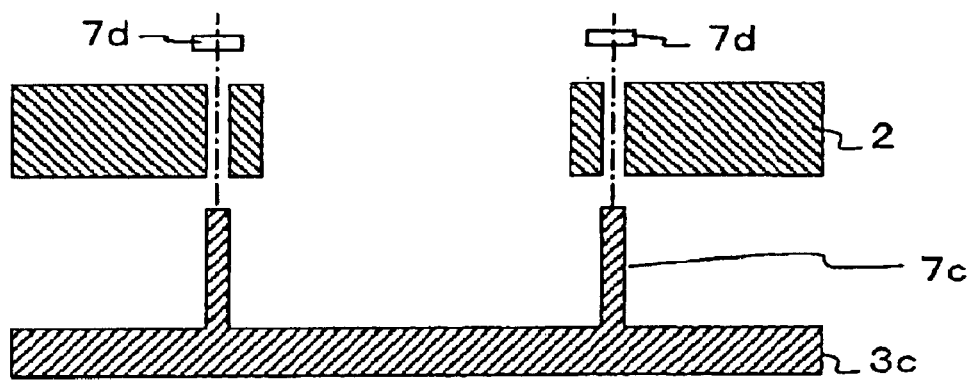
Figure 10:
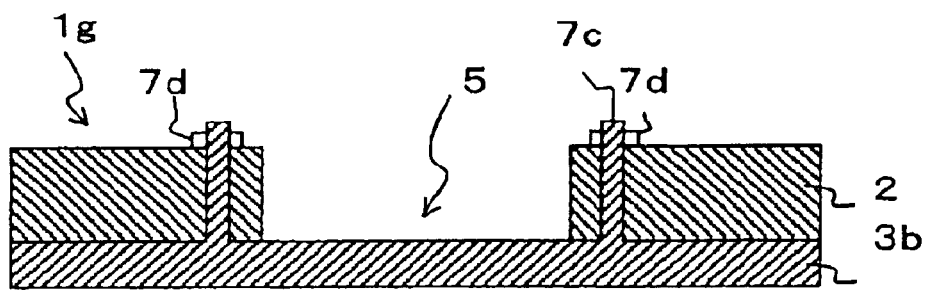

FIGS. 8 to 10 show a method for joining the plastic circuit board and the heat sink by using the integrally molded caulking member, rivet, and screw respectively. As shown in FIG. 8(a), FIG. 9(a), or FIG. 10(a), a thermal enhanced type of BGA package, according to the first invention, may has a structure in which the plastic circuit board 2 is joined to a heat sink 3a by the caulking member 7a integrally molded, a heat sink 3b with the rivet 7b integrally molded, or a heat sink 3c with the screw 7c integrally molded.

For example, as shown in FIG. 8(b), the plastic circuit board may be joined to the heat sink in a manner that the plastic circuit board 2 is placed on the heat sink 3a and the caulking member 7a, provided on the heat sink 3a is folded. As shown in FIG. 9(b), it may be also joined in a manner that the projected portion of the rivet 7b is inserted into a through hole provided in the plastic circuit board 2 and an end of the projected portion of the rivet 7b is pressed by a pressing machine. As shown in FIG. 10(b), it may be also joined in a manner that the threaded projected portion of the screw 7c is inserted into a through hole provided in the plastic circuit board 2 and the nut 7d is fastened.

A semiconductor chip is mounted on the thermal enhanced type of BGA package, having the structure described above, to be commercialized as a semiconductor device. A thermal enhanced type of BGA package in which the plastic circuit board is joined to the heat sink by the rivet will be explained as an example.

Figure 11:
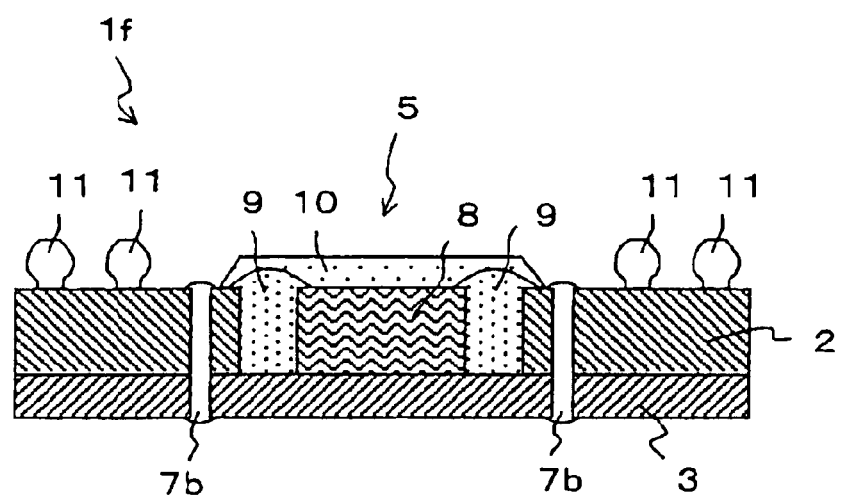
FIG. 11 shows an example of a semiconductor device in which a semiconductor chip is mounted on a thermal enhanced type of BGA package.

FIG. 11 shows an example of a semiconductor device in which a semiconductor chip is mounted on a thermal enhanced type of BGA package. As shown in FIG. 11, if a semiconductor chip 8 is mounted on the cavity 5 of the thermal enhanced type of BGA package 1f, the semiconductor chip 8 is connected to the plastic circuit board 2 by a bonding wire 9, the semiconductor chip 8 is sealed by sealing resin 10, and a solder ball 11 is placed on a surface of the plastic circuit board 2; this can be used as a semiconductor device.

The plastic circuit board, used in the thermal enhanced type of BGA package of the invention, may be a board consisting of a single layer or a multi-layer, which includes a base material made of resin such as BT resin (resin containing mainly bismaleimide triazine), an epoxy resin having good heat resistance, dielectric properties, insulating characteristics, and workability. The board may have a circuit pattern of conductive wiring formed from copper foil or copper plating by a photolithographic method or an etching method. The heat sink is formed from a metal plate, for example, a copper plate and a copper alloy plate, having an excellent property of thermally enhancement. The heat sink, whose opposite surface from the surface joined to the plastic circuit board is made by an anti-oxidizing treatment of Ni plating. On the other hand, it is preferable that an oxide copper layer is formed on the surface which is joined to the plastic circuit board of the heat sink by chemical treatment such as black oxidation, in order to increase adhesiveness of an Ag paste or the sealing resin, used for joining the bottom portion of the cavity and the semiconductor chip.

As described above, in the thermal enhanced type of BGA package, according to the first invention, a problem due to use of a bonding agent does not take place because no bonding agent is used, and a sufficient bonding strength between the plastic circuit board and the heat sink can be obtained since the plastic circuit board and the heat sink are mechanically joined. When a solder resist film, which is charged in the through hole provided in the plastic circuit board, is formed, the moisture which moves into the resin material or the bonding agent is discharged from a small gap between the plastic circuit board and the heat sink. Therefore the popcorn phenomenon from heating of the reflow soldering is not generated, so the problem of destruction of the thermal enhanced type of BGA package does not take place.

However, problems that need to be improved, (V) to (VII) below, still remain in the thermal enhanced type of BGA package in which the caulking member, the rivet, or the screw is used for the clamping member.

(V) When the plastic circuit board and the heat sink are joined by the caulking member, it is necessary that the heat sink is set up with the caulking member by the integrated molding or the welding. It takes excessive time to produce the heat sink set up with the caulking member.

(VI) When the plastic circuit board and the heat sink are joined by the rivet, it takes excessive time to insert the rivet into the through hole used in the plastic circuit board and the heat sink. When the rivet is integrally molded with the heat sink, it takes excessive time similar to (V) above. When the plastic circuit board and the heat sink are joined by the solid rivet, a great deal of pressure is required, so that it takes excessive time to rivet and the damage from riveting in the plastic circuit board could take place. When an outer diameter of the rivet is expanded in order to increase the bonding strength, further great deal of pressure is required and the damage of the plastic circuit board could easily take place.

(VII) In the method in which the plastic circuit board and the heat sink are mechanically joined by the screw and the nut, it takes excessive time to rotate the nut and a crack could take place on the surface of the solder resist formed on the plastic circuit board.

A thermal enhanced type of BGA package, in which the above-described problems (V) to (VII) are solved, will be described below.

Figure 12:
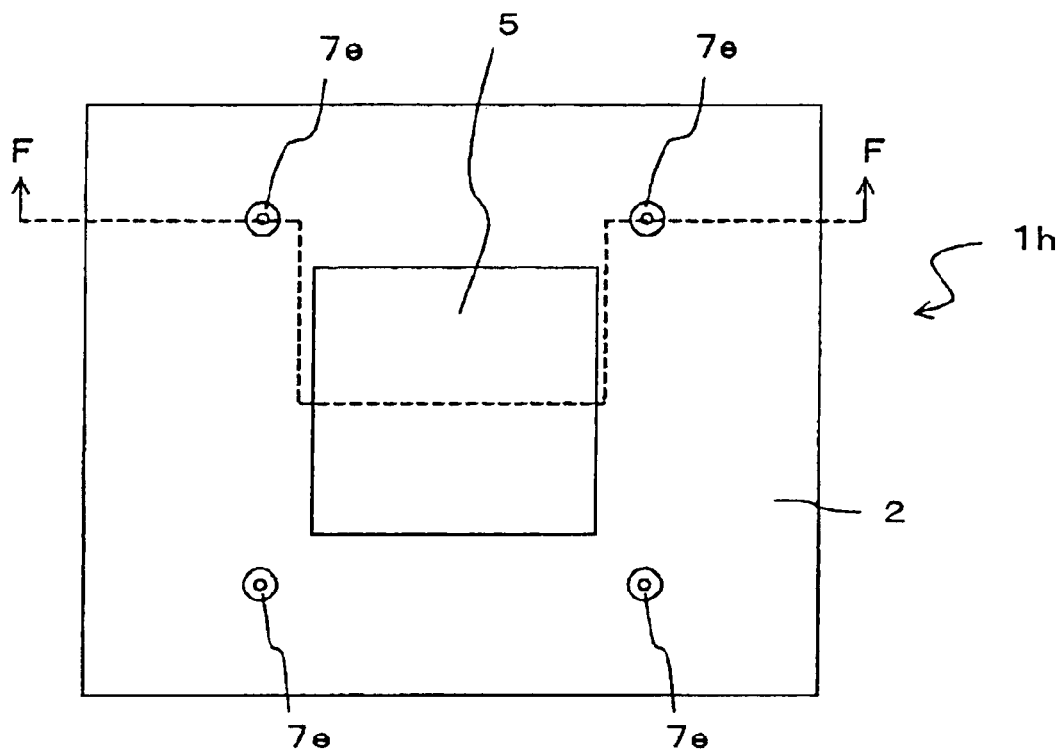
FIG. 12 shows an example of a thermal enhanced type of BGA package according to the first invention in which an eyelet is used for a clamping member.
Figure 12:
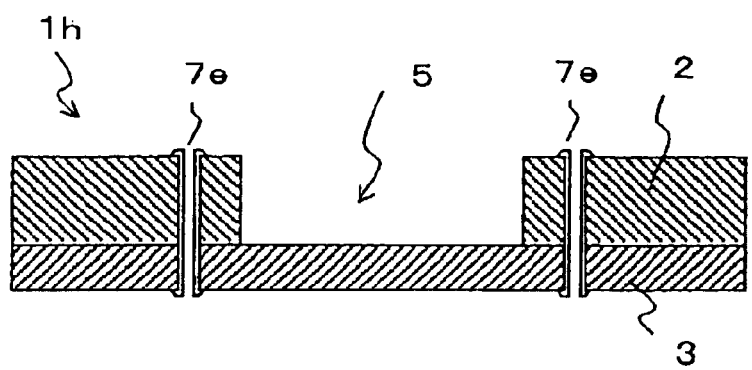

FIG. 12 shows a thermal enhanced type of BGA package, according to the first invention, in which an eyelet is used for the clamping member. FIG. 12(a) shows a plan view and FIG. 12(b) is a cross-sectional view taken on a broken line in FIG. 12(a).

As shown in FIG. 12, the metal heat sink 3 is joined to one surface of a thermal enhanced type of the BGA package 1h. The thermal enhanced type of BGA package 1h includes the plastic circuit board 2 having a cutout space in the central portion and the cavity 5 formed by an exposure surface of the heat sink 3. The plastic circuit board 2 and the heat sink 3 are firmly joined by one or more eyelets 7e. The eyelet 7e is a cylindrical pin having a hollow, the plastic circuit board 2 and the heat sink 3 are joined by depressing an upper and a lower ends of the eyelet 7e to expand outward from the central axis.

For example, a metal pin, which is made of a base material having good corrosion resistance such as a copper alloy and stainless steel and has the cylindrical body with the hollow portion, may be used for the eyelet 7e. In order to reduce production time of the thermal enhanced type of BGA package, it is desirable to use the eyelet 7e, whose hollow portion at one end is depressed to expand outward from the central axis and formed to a sword guard shape.

Figure 13:
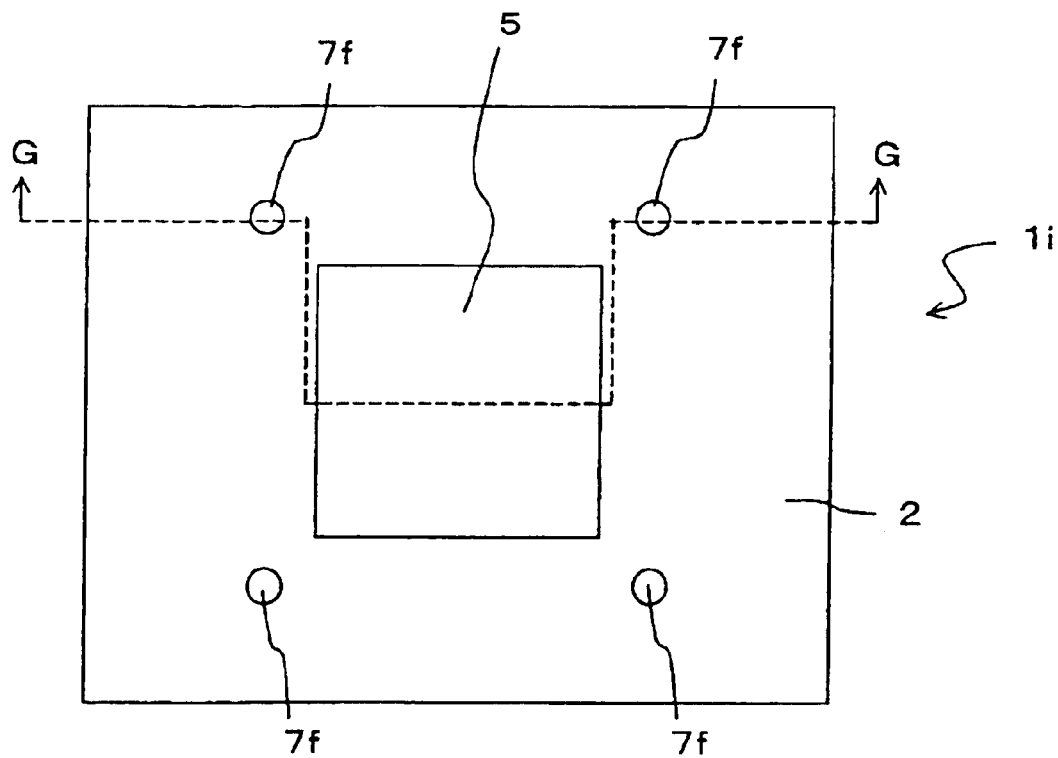
FIG. 13 shows an example of a thermal enhanced type of BGA package according to the first invention in which a tubular rivet is used for a clamping member.
Figure 13:
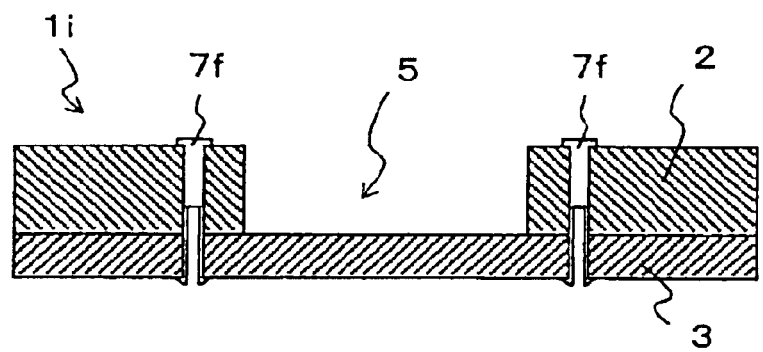

FIG. 13 shows a thermal enhanced type of BGA package, according to the first invention, in which a tubular rivet is used for the clamping member. FIG. 13(a) shows a plan view and FIG. 13(b) is a cross-sectional view taken on a broken line in FIG. 13(a).

As shown in FIG. 13, in a thermal enhanced type of BGA package 1i, after a tubular rivet 7f is inserted into each through hole provided in the plastic circuit board 2 and heat sink 3 and then the plastic circuit board 2 and the heat sink 3 are firmly joined by depressing the hollow end of the tubular rivet 7f to expand outward from the central axis.

A tubular rivet is a cylindrical rivet, which is made of metal such as a copper alloy or stainless steel, having good corrosion resistance, including a sword cylindrical body at one end and a notch portion in the shape of cylindrical hollow, along an axis line of the cylindrical body at the other end. The dimension of the notch portion in the shape of cylindrical hollow is not particularly limited. Accordingly, a full-tubular rivet, having the notch near the sword guard portion is applicable, and a semi-tubular rivet, having the notch near a middle point in the axis direction of the tubular rivet is also applicable, as shown in FIG. 12(b).

As described above, the problem of excessive production time, as in the case of the caulking member, the rivet and the screw, can be solved by using the eyelet or the tubular rivet for the clamping member. When the end of the eyelet or the tubular rivet is depressed to expand, a great deal of pressure is not required compared with the rivet. Consequently, in the thermal enhanced type of BGA package, in which the eyelet or the tubular rivet is used, the damage is not generated in the plastic circuit board and also the crack of the solder resist film from clamping the screw and the nut is not generated.

In the thermal enhanced type of BGA package of the first invention, it is desirable that a dam member is placed on the plastic circuit board. The reason of this will be described by an example as In case the rivet is mainly used for the clamping member.

Figure 14:
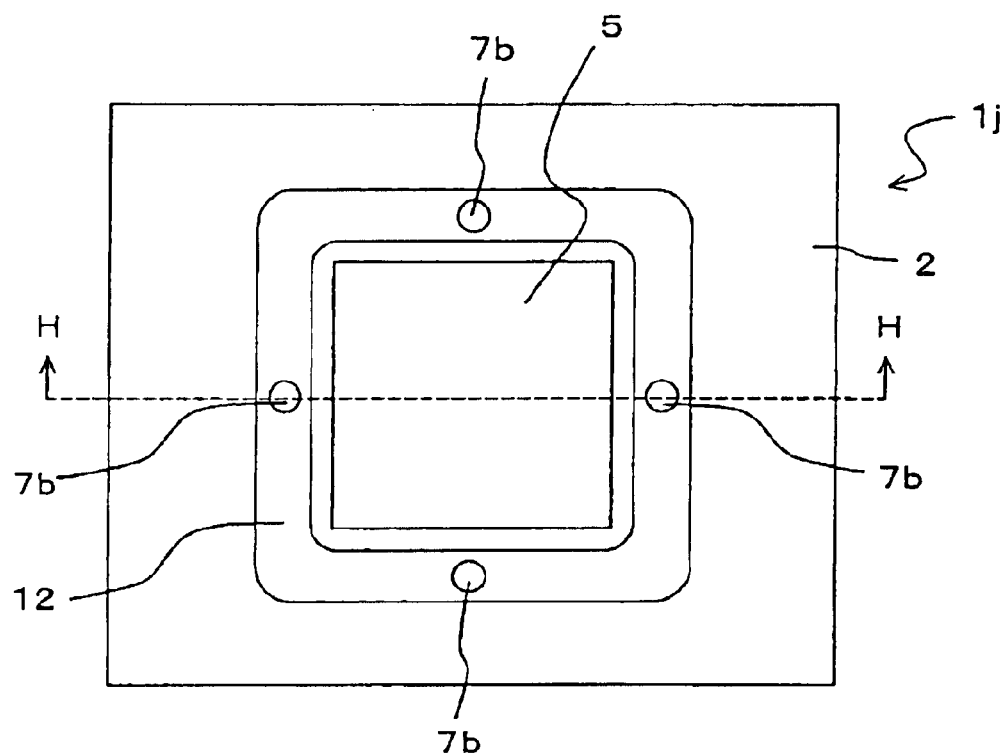
FIG. 14 shows an example of a thermal enhanced type of BGA package having a dam member.
Figure 14:
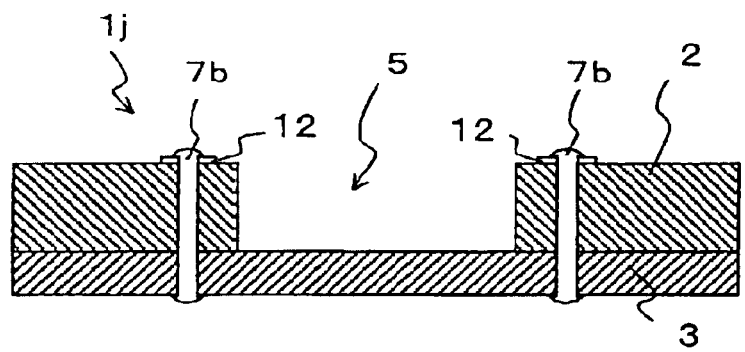
Figure 15:
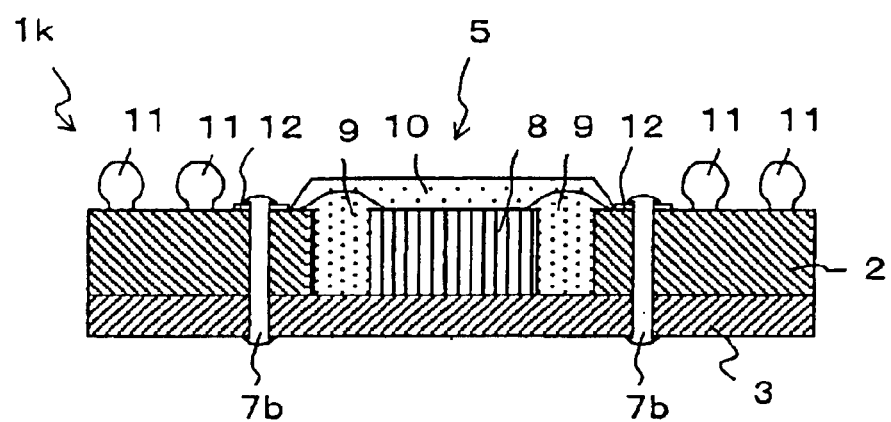
FIG. 15 shows an example of a semiconductor device in which a semiconductor is mounted on a thermal enhanced type of BGA package having a dam member.

FIG. 14 shows a thermal enhanced type of BGA package having the dam member, FIG. 14(a) shows a plan view, and FIG. 14(b) is a cross-sectional view taken on a broken line in FIG. 14(a). FIG. 15 is a cross-sectional view showing a state in which the semiconductor chip is mounted on the thermal enhanced type of BGA package.

As shown in FIG. 14, a thermal enhanced type of BGA package 1j, according to the first invention, has the cavity 5 formed by a cutout space, provided in the central portion of the plastic circuit board 2, and the exposure surface of the heat sink 3. And this package has a dam member 12 placed on the plastic circuit board 2, in which the outer periphery portion of the cavity 5 is enveloped. The dam member 12 is firmly joined to the plastic circuit board 2 and the heat sink 3 by one or more rivets 7b (four rivets 7b are used in FIG. 14).

As shown in FIG. 15, in a thermal enhanced type of BGA package 1k, a semiconductor chip 8 is connected to the plastic circuit board 2 by a bonding wire 9, and then sealed by sealing resin 10, so the dam member 12 can prevent the sealing resin 10 from overflowing.

Figure 16:
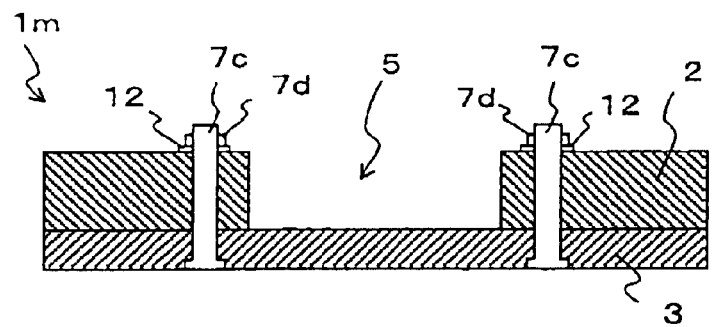
FIG. 16 shows an example of a thermal enhanced type of BGA package having a dam member.
Figure 16:
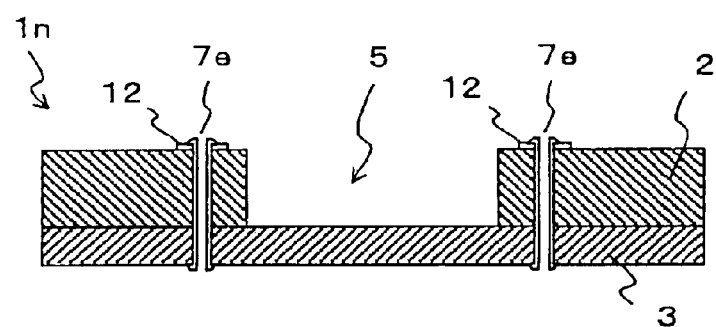
Figure 16:
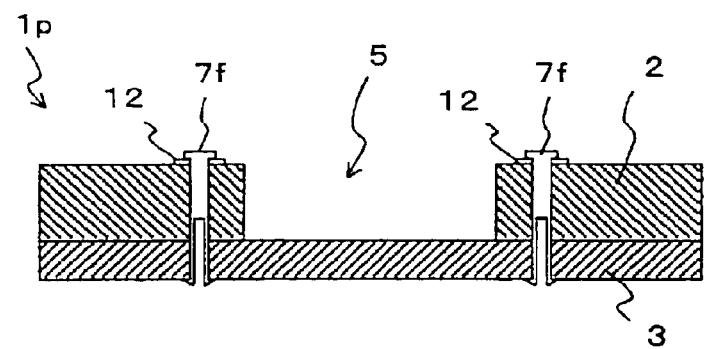

In a thermal enhanced type of BGA package 1m, shown in FIG. 16(a), the screw 7c is used for the damping member, the plastic circuit board 2 and the heat sink 3 are joined by the nut 7d. In a thermal enhanced type of BGA package 1n, shown in FIG. 16(b), the eyelet 7e is used for the clamping member, the plastic circuit board 2 and the heat sink 3 are joined by depressing the ends of the eyelet 7e to expand outward from the central axis. In a thermal enhanced type of BGA package 1p, shown in FIG. 16(c), the tubular rivet 7f is used for the damping member, the plastic circuit board 2 and the heat sink 3 are joined by depressing one end of the tubular rivet 7f to expand outward from the central axis. In these thermal enhanced type of BGA packages, the same effect in which the rivet is used can be obtained.

Figure 25:
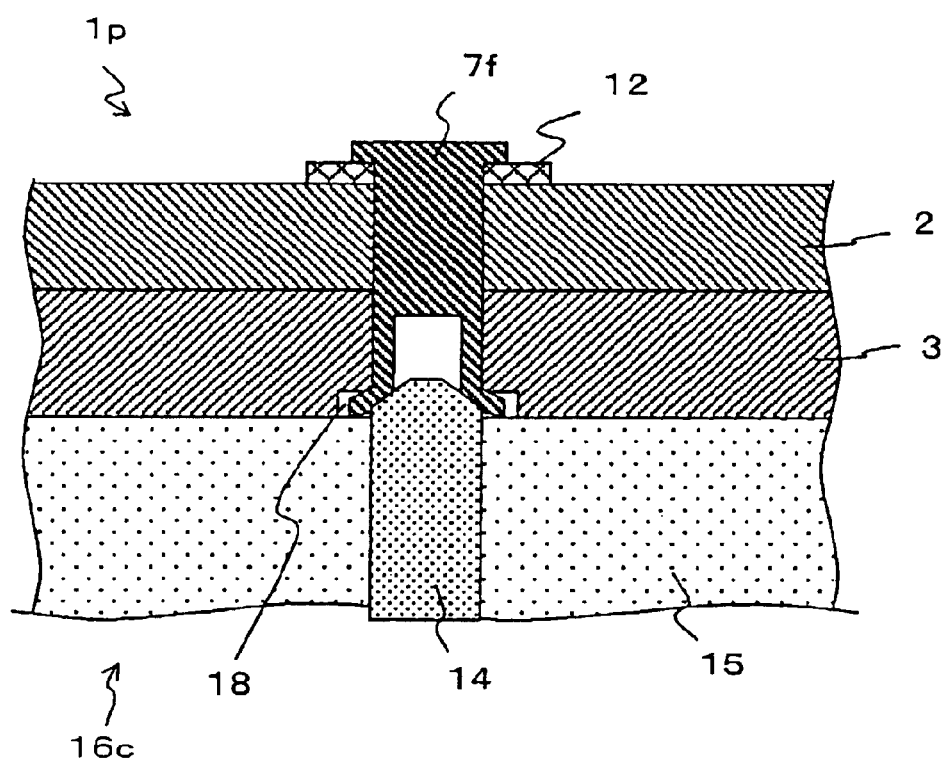

When the rivet, the screw, the eyelet, or the tubular rivet is used for the clamping member, it is desirable that a part corresponding to the through hole in the bottom surface (opposite surface from the surface joined to the plastic circuit board) of the heat sink has, for example as shown in FIG. 25, a counter bore portion having a larger diameter than the diameter of the through hole. Since the thermal enhanced type of BGA package, having a structure which can store the end of the clamping member, such as the rivet, without a projection from the bottom portion of the heat sink, flatness of the bottom portion of the heat sink can be maintained.

The thermal enhanced type of BGA package of this invention may include a metal plate between the plastic circuit board and the heat sink. The metal plate has the cutout space whose position and size are substantially the same as the plastic circuit board. The metal plate serves as an intermediate body for horizontal positioning; for possible wire-bonding between the semiconductor chip and the plastic circuit board, and for promoting heat generation of the semiconductor chip. A resin plate instead of the metal plate or a multilayered plastic circuit board is also applicable, and a combination of these materials, including the metal plate, is also applicable.

B. A Thermal Enhanced Typeof BGA Package According to the Second Invention

The second invention is the invention which has been done in order to solve the problem of (IV). An embodiment of the thermal enhanced type of BGA package according to the second invention will be explained by describing the case where the eyelet is used for the clamping member.

Figure 17:
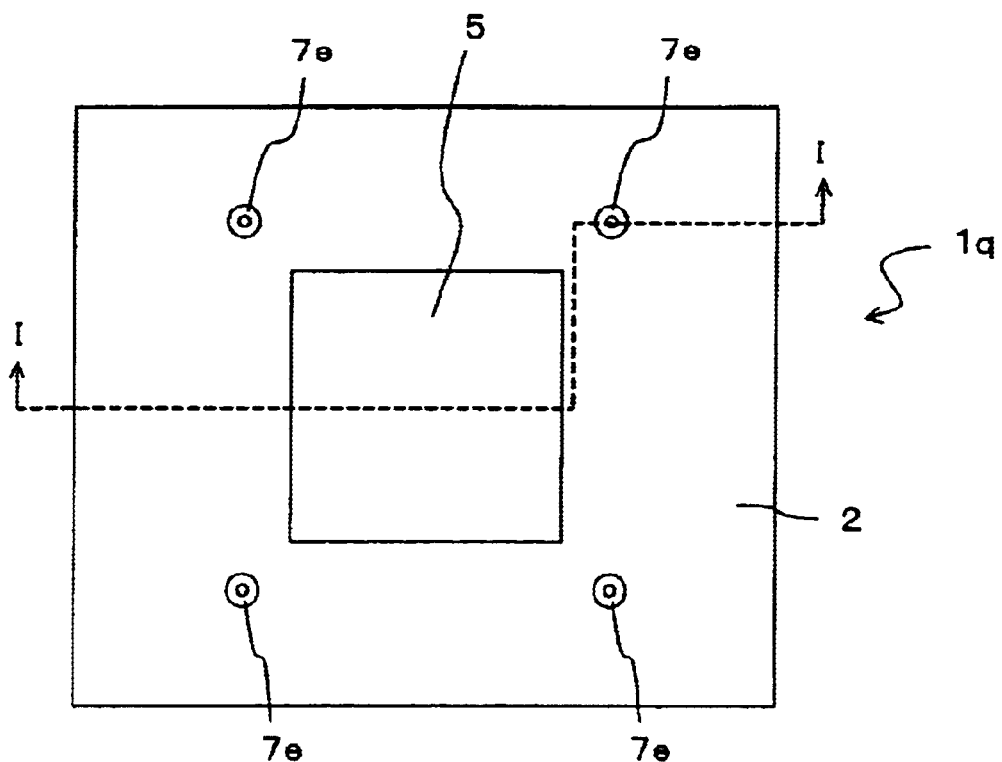
FIG. 17 and FIG. 18 show an example of a thermal enhanced type of BGA package according to the second invention. In each figure, figure (a) shows a plan view and figure (b) shows a cross-sectional view taken on a broken line in figure (a)
Figure 17:
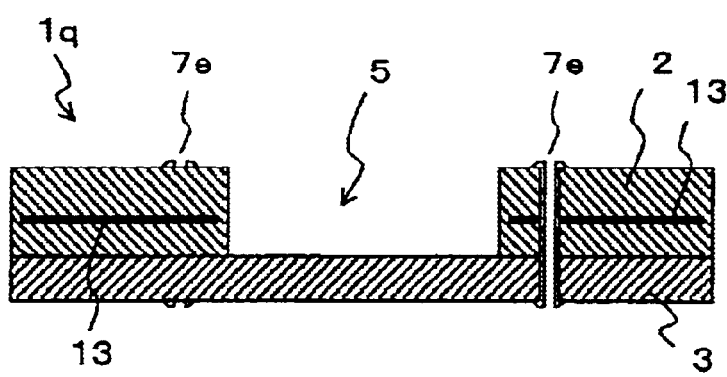
Figure 18:
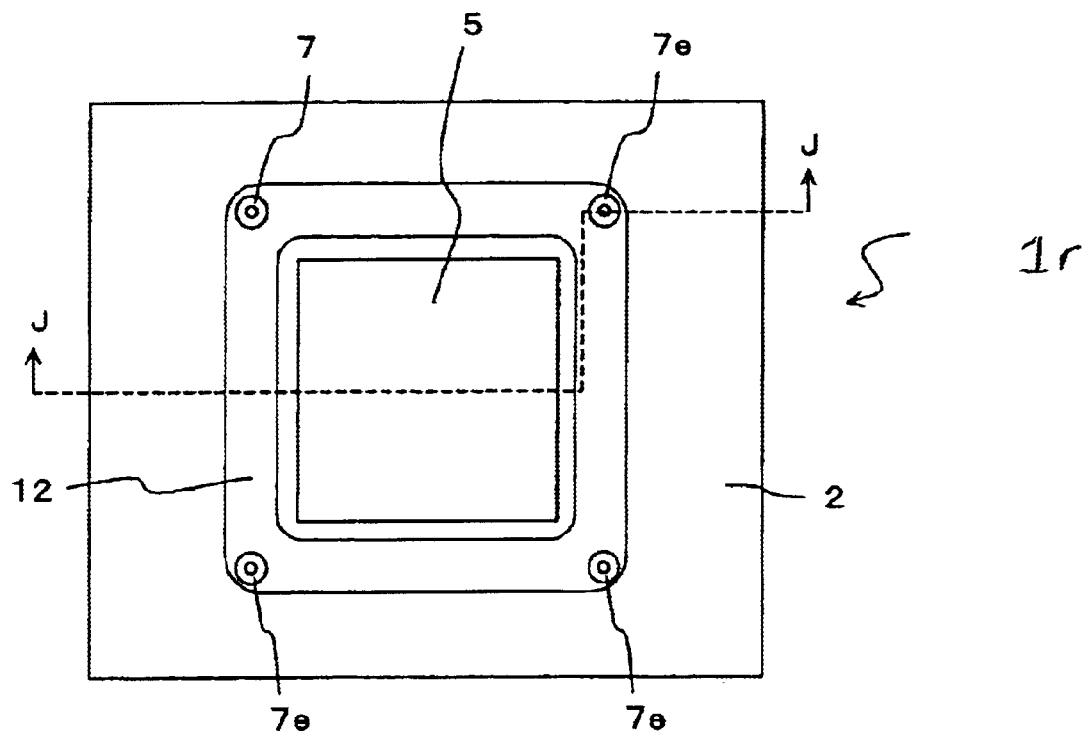
Figure 18:
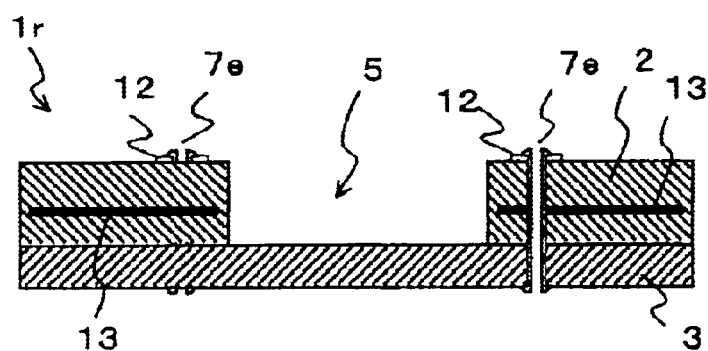

FIG. 17 and FIG. 18 show an example of the thermal enhanced type of BGA package according to the second invention. In each figure, figure (a) shows a plan view and figure (b) shows a cross-sectional view taken on a broken line in figure (a).

As shown in FIG. 17, a thermal enhanced type of BGA package 1q has a structure in which the eyelet 7e is inserted into one or more through holes provided in the plastic circuit board 2 and the heat sink 3 respectively four positions shown in FIG. 17), the plastic circuit board 2 and the heat sink 3 are joined by depressing the end of the eyelet 7e to expand outward from the central axis. A circuit pattern 13 is provided in the plastic circuit board 2, and the heat sink 3 is electrically connected to a part of the circuit pattern 13 through the eyelet 7e.

As shown in FIG. 18, a thermal enhanced type of BGA package 1r, has a structure in which the eyelet 7e is inserted into one or more through holes provided in the plastic circuit board 2, the heat sink 3, and the dam member 12 respectively (four positions shown in FIG. 18), and the plastic circuit board 2, the heat sink 3, and the dam member 12 are joined by depressing the end of the eyelet 7e to expand outward from the central axis. The circuit pattern 13 is provided in the plastic circuit board 2, and then the heat sink 3 and the dam member 12 are electrically connected to a part of the circuit pattern 13 through the eyelet 7e.

Since the thermal enhanced type of BGA packages 1q and 1r, according to the second invention, have the structure described above, the plastic circuit board 2 and the heat sink 3 or the plastic circuit board 2, the heat sink 3, and the dam member 12 can be firmly joined and the high-frequency noise caused by the plastic circuit board 2, the heat sink 3, and the dam member 12 can be prevented.

It is desirable that the eyelet 7e is connected to the plastic circuit board 2 and the heat sink 3 or the plastic circuit board 2, the heat sink 3, and the dam member 12 by solder (not shown). The reason for this is that the bonding strength between the clamping member and the plastic circuit board 2 and the heat sink 3, or the plastic circuit board 2, the heat sink 3, and the dam member 12 can be further increased by the solder, and the electrical connection between the circuit pattern 13 and the heat sink 3 or the heat sink 3 and the dam member 12 can be maintained by the solder.

The rivet, the screw, or the tubular rivet may be used instead of the eyelet as the clamping member.

C. A Manufactiring Method of a Thermal Enhanced Typeof BGA Package According to the First Invention First, a manufacturing method of the plastic circuit board and the heat sink used for the thermal enhanced type of BGA package, according to the invention, will be described.

The plastic circuit board, used in the thermal enhanced type of BGA package of the invention, may be a board consisting of a single layer or a multi-layer, which includes a base material made of resin such as BT resin (resin containing mainly bismaleimide triazine), an epoxy resin having good heat resistance, dielectric properties, insulating characteristics, and workability. A cutout space is formed by punching or routing in the central portion of the plastic circuit board, which has a circuit pattern of conductive wiring formed from copper foil or copper plating, by a photolithographic method or an etching method.

The heat sink, which is used in the thermal enhanced type of BGA package of the invention, is formed from a metal plate, such as a copper plate or a copper alloy plate having excellent property of thermal enhancement. On the opposite surface, which is the surface joined to the plastic circuit board, of the heat sink, could be applied anti-oxidizing treatment such as Ni plating. On the other hand, it is recommended that an oxide copper layer is formed on the surface, which is joined to the plastic circuit board, of the heat sink, by chemical treatment, such as black oxidation, in order to increase the adhesiveness of an Ag and a sealing resin paste which are used for joining the bottom portion of the cavity and the semiconductor chip.

Next, the method of joining the plastic circuit board and the heat sink by various kinds of the clamping members will be described.

As shown in FIGS. 3, 4, 5, or 8, in the manufacturing method, in which the caulking member is used for the clamping member, for example, the heat sink 3, joined to the caulking member 7a by welding, or the heat sink 3a, integrally molded with the caulking member 7a, is prepared; the heat sink 3 (or 3a) and the plastic circuit board 2 is superimposed. Then the end of the caulking member 7a may be folded to mechanically join the plastic circuit board 2 and the heat sink 3 (or 3a).

As shown in FIG. 6, in the manufacturing method, in which the rivet is used as the clamping member, for example, the through holes are provided by drilling at certain positions in the plastic circuit board 2 and the heat sink 3, and, then the rivets 7b are inserted after superimposing them, and the plastic circuit board 2 and the heat sink 3 may be mechanically joined by depressing the end of the rivet. As shown in FIG. 9, the through holes are provided by drilling at a certain position in the plastic circuit board 2 and the heat sink 3b, in which the rivet 7b is integrally molded at a certain position, is prepared beforehand; the plastic circuit board 2 and the heat sink 3b are superimposed and the plastic circuit board 2 and the heat sink 3b may be mechanically joined by depressing the end of the rivet 7b.

As shown in FIG. 7, in the manufacturing method, in which the screw is used for the clamping member, for example, the through holes are provided by drilling at certain positions in the plastic circuit board 2 and the heat sink 3, then the screw 7c is inserted after superimposing them, the plastic circuit board 2 and the heat sink 3 may be mechanically joined by attaching the nut 7d to the end of the screw 7c. As shown in FIG. 10, the through hole is provided by drilling at a certain position in the plastic circuit board 2 and the heat sink 3c, in which the screw 7c is integrally molded at a certain position, is prepared beforehand; the plastic circuit board 2 and the heat sink 3c are superimposed, and the plastic circuit board 2 and the heat sink 3c may be mechanically joined by attaching the nut 7d to the end of the screw 7c.

As shown in FIG. 12, in the manufacturing method, in which the eyelet is used as the clamping member, for example, the through holes are provided by drilling at certain positions in the plastic circuit board 2 and the heat sink 3, then the eyelet. 7e is inserted after superimposing them, and the plastic circuit board 2 and the heat sink 3 may be mechanically joined by depressing the upper and lower portion of the eyelet 7e to expand outward from the central axis with a pressing jig for the eyelet.

As shown in FIG. 13, In case the manufacturing method in which the tubular rivet is used for the clamping member, for example, the through holes are provided by drilling at certain positions in the plastic circuit board 2 and the heat sink 3, then the tubular rivet 7f is inserted after superimposing them, the plastic circuit board 2 and the heat sink 3 may be joined mechanically by depressing the upper and lower portion of the tubular rivet 7f to expand in the outside direction to the axis.

In the manufacturing method of the thermal enhanced type of BGA package using the dam member, the through holes are provided beforehand at certain positions of the dam member, then the dam member is superimposed on the plastic circuit board and the heat sink, and the joining methods described above are applicable.

In the manufacturing method of the thermal enhanced type of BGA package in which the eyelet having a sword guard shaped end is used for the clamping member, the manufacturing method described below is particularly desirable, though the methods described above may be applicable.

Figure 19:
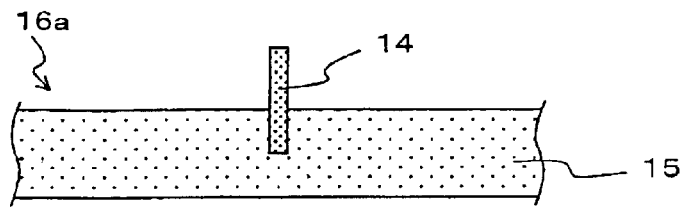
FIG. 19 shows an example of a manufacturing method of a desirable thermal enhanced type of BGA package in case where an eyelet whose one end is in a shape of sword guard is used for a clamping member.
Figure 19:
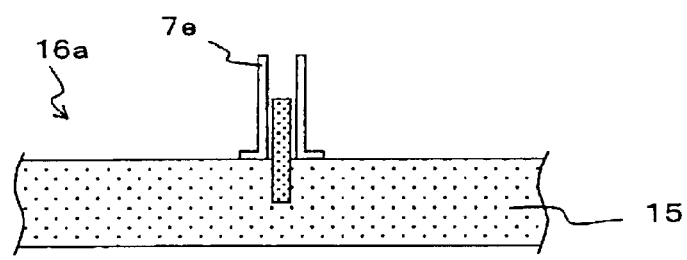
Figure 19:
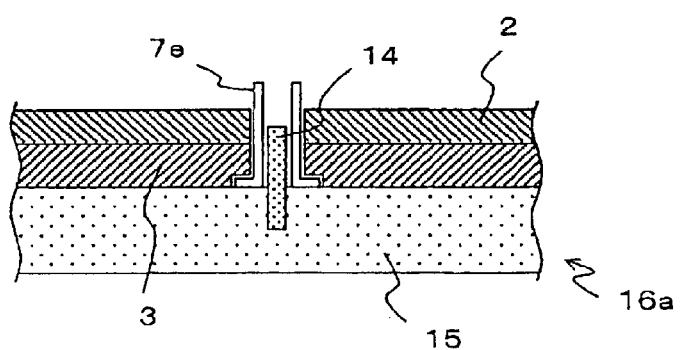
Figure 19:
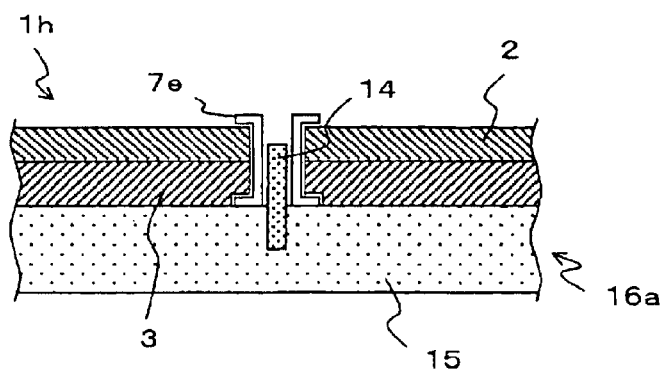

FIG. 19 shows the process of a manufacturing method of the thermal enhanced type of BGA package when the eyelet, whose one end is the sword guard shaped, is used for the clamping member. FIGS. 19(a) to 19(d) show a state of each member in each step respectively.

As shown in FIG. 19(a) and FIG. 19(b), an alignment jig 16a, in which one or more guide pins 14, having a smaller outer diameter than an inner diameter of a hollow portion of the eyelet 7e, are perpendicularly provided at certain positions on a support mount 15, is prepared. The guide pin 14 is perpendicularly provided at a certain position in which the eyelet is inserted. Even though the material of the support mount 15 is not limited, a metal plate or a resin plate may be used. The eyelet 7e is inserted into the guide pin 14 of the alignment jig 16a with the sword guard shaped end of the eyelet 7e abutted to an upper surface of the support mount 15.

By using a drilling machine or a punching pin (not shown), a through hole, having substantially the same outer diameter of the cylindrical portion of the eyelet 7e, is provided at certain positions of the plastic circuit board 2 and the heat sink 3.

As shown in FIG. 19(c), the heat sink 3 and the plastic circuit board are thrust into the eyelet 7e and placed on the guide pin 14 of the alignment jig 16a. Then, as shown in FIG. 19(d), the end of the eyelet 7e is depressed by a pushing member (not shown) to expand along a perimeter of the cylindrical portion in a plan view on the upper surface of the plastic circuit board 2. This causes a joined body can be formed in which the plastic circuit board 2 and the heat sink 3 are firmly joined. When the joined body formed by the process described above is taken out from the guide pin 14, the thermal enhanced type of BGA package 1h is produced.

The thermal enhanced type of BGA package is manufactured by the above-described method when the eyelet whose one end is the sword guard shape is used for the clamping member, so that the plastic circuit board and the heat sink or the plastic circuit board, the heat sink and the dam member can be mechanically joined with ease and preciseness. Since the joining can be done by the low-cost eyelet and the pushing member with the small pressure for only depressing the end of the eyelet to expand even though the outer diameter of the eyelet becomes large, the yield is not reduced and the low-cost thermal enhanced type of BGA package having high bonding strength can be produced. Furthermore, since a small gap between the plastic circuit board and the heat sink is formed, moisture is discharged from the small gap even though there is overheat, which prevents the popcorn phenomenon from generating.

Figure 20:
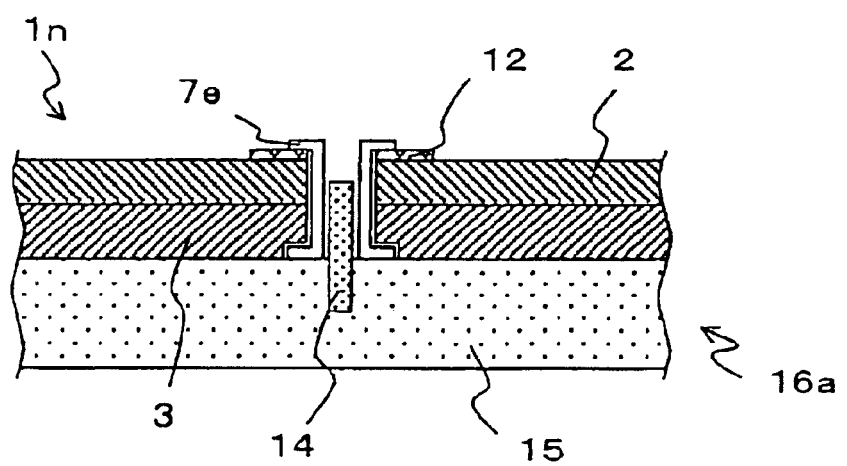
FIG. 20 shows an example of a manufacturing method of a desirable thermal enhanced type of BGA package further including a dam member in case where an eyelet whose one end is in a shape of sword guard is used for a clamping member.

FIG. 20 shows an example of a manufacturing method of the thermal enhanced type of BGA package, including the dam member when the eyelet whose one end is in the sword guard shape and is used for the clamping member. As According to the above-described method, the plastic circuit board 2 and the heat sink 3 are thrust in the cylindrical portion of the eyelet 7e, and the dam member, having the through hole provided at substantially the same position as the through holes of the plastic circuit board 2 and the heat sink 3, is thrust in the cylindrical portion of the eyelet 7e.

At this point, it is preferable that the plastic circuit board 2 is inserted between the heat sink 3 and the dam member 12 in order to join them together. The reason for this is to prevent cracks and defects from appearing on the surface of the plastic circuit board 2, since the end of the eyelet 7e is not in contact with the surface of the plastic circuit board 2, even if the end of the eyelet 7e is depressed by the pushing member.

Figure 21:
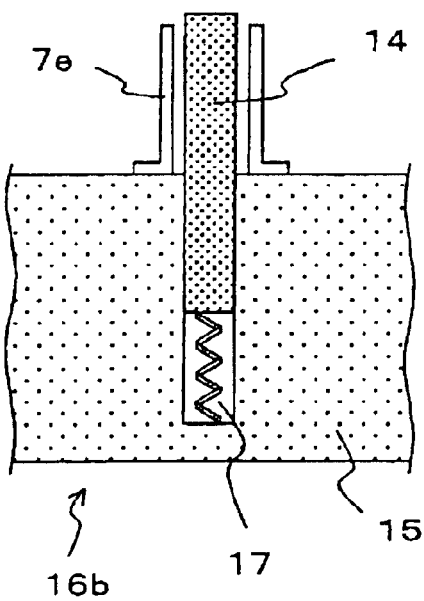
FIG. 21 shows an example of a manufacturing method of a desirable thermal enhanced type of BGA package in case where an eyelet whose one end is in a shape of sword guard is used for a damping member.
Figure 21:
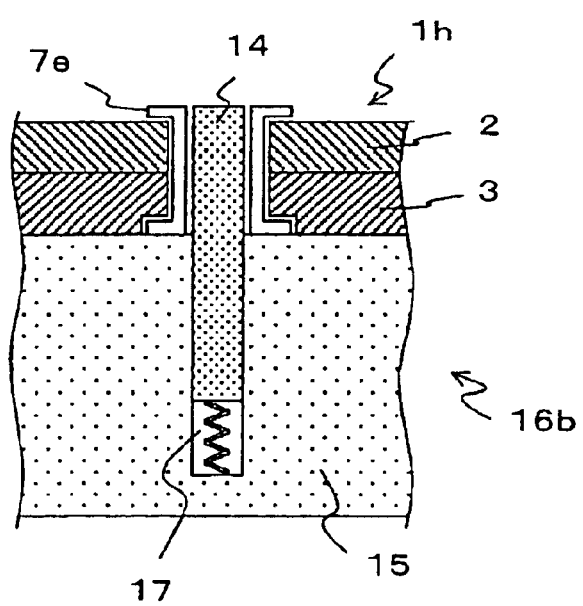

FIG. 21 shows an example of a desirable manufacturing method of the thermal enhanced type of BGA package when the eyelet whose one end is in the sword guard shape and is used for the clamping member. In the alignment jig 16b, the guide pin 14, being movable both upward and downward is perpendicularly provided in a certain position in the support mount 15. It is preferable that the guide pin 14 can move downward following the depression of the eyelet 7e. For example, it is preferable that a bore hole 17 is provided in order for the guide pin 14 to move perpendicularly in the support mount 15 and the guide pin 14 is movable both upward and downward in the bore hole 17. Furthermore, it is preferable that an elastic body is placed between the guide pin 14 and a bottom of the bore hole 17, and also the plastic circuit board 2 and the heat sink 3 or the plastic circuit board 2, the heat sink 3 and the dam member 12 are joined, while the guide pin 14 is moved downward following the depression of the eyelet 7e. When the pressure to the guide pin 14 is released, the guide pin 14 is pushed upward by the elastic body as the spring returns to it's initial position.

Though the method for depressing the end of the eyelet is not limited, it is desirable to depress the end of the eyelet by the pushing member which is controlled amount of pressure. According to this method, since only a certain amount of pressure is applied, the joining can be maintain without generating cracks and defects in the plastic circuit board or the dam member.

If the manufacturing method of the thermal enhanced type of BGA package, in which the tubular rivet is used for the clamping member, the manufacturing method described below is particularly desirable, though the methods described above may be applicable.

Figure 22:
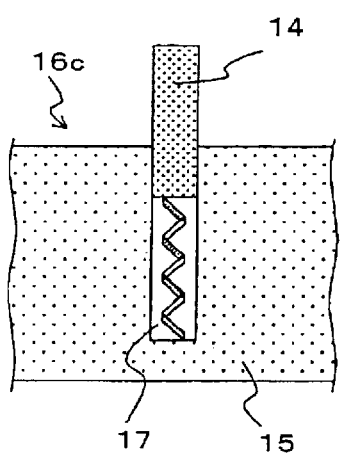
FIG. 22 shows an example of a manufacturing method of a thermal enhanced type of BGA package in case where a tubular rivet is used for a clamping member.
Figure 22:
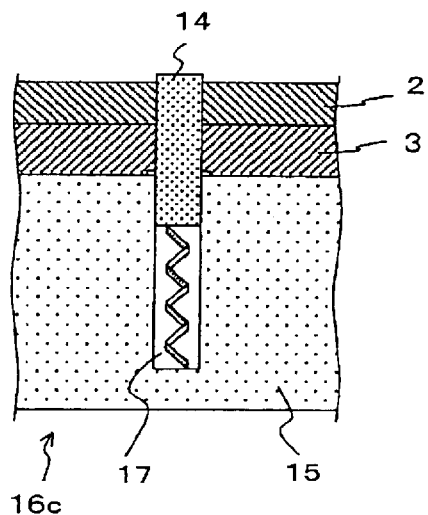
Figure 22:
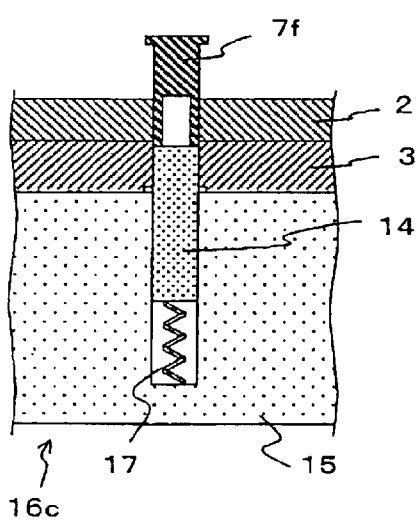
Figure 22:
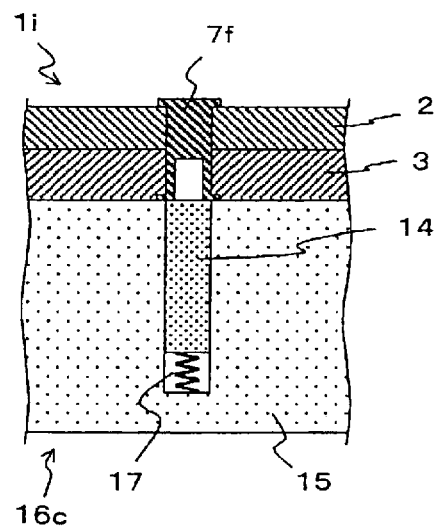

FIG. 22 shows an example of the manufacturing method of the thermal enhanced type of BGA package when the tubular rivet is used for the clamping member. FIGS. 22(a) to 22(d) show the state of each member in each step respectively.

As shown in FIG. 22(a), an alignment jig 16c, in which one or more guide pins 14, having substantially the same diameter as an outer diameter of a cylindrical portion of the tubular rivet 7f, are provided perpendicularly at certain positions on a support mount 15. The alignment jig 16c may be useable when the elastic body is placed in the bore hole 17 provided in the support mount 15 and the guide pin 14 is provided on the elastic body.

By using the drill machine or the punching pin (not shown), a through hole, having the substantially same as the outer diameter of the cylindrical portion of the tublar rivet 7f, is provided at certain positions of the plastic circuit board 2 and the heat sink 3.

As shown in FIG. 22(b), the through hole of the heat sink 3 is thrust onto the guide pin 14, which is provided perpendicularly and projected from the upper surface of the alignment jig 16c, with the certain position aligned, and then, in the same way, the through hole of the plastic circuit board 2 is thrust onto the guide pin 14 to place on the alignment jig 16c.

As shown in FIG. 22(c), the tubular rivet 7f is inserted in the plastic circuit board 2 and the heat sink 3 by depressed the sword guard shaped end of the tubular rivet 7f, with the cylindrical shaped end surface of the tubular rivet 7f abutted on the surface of the upper end of the guide pin 14. At this point, the guide pin 14 follows the depression of the tubular rivet 7f and is pushed down further into the bore, hole 17.

Then, as shown in FIG. 22(d), the guide pin 14 stops it's downward movement with the upper end of the guide pin 14 projected slightly (more than 0 mm to less than 2 mm) above the upper surface of the support mount 15. The sword guard shaped end of the tubular rivet 7f is further depressed to expand the cylindrical shaped end of the tubular rivet 7f in an outside direction by the guide pin 14 which projects above the upper surface of the support mount 15.

In case the thermal enhanced type of BGA package is manufactured by the above-described method where the tubular rivet is used for the clamping member, the plastic circuit board 2 and the heat sink 3 can be firmly joined by the sword guard shaped end and the expanded cylindrical shaped end of the tubular rivet 7f without the special damping member or taking time for joining the screw and the nut. Since the plastic circuit board and the heat sink can be joined by a press machine with little pressure, the damage of the plastic circuit board or the crack of the solder resist film is not generated, a firmly joined thermal enhanced type of BGA package can be produced easily.

Figure 23:
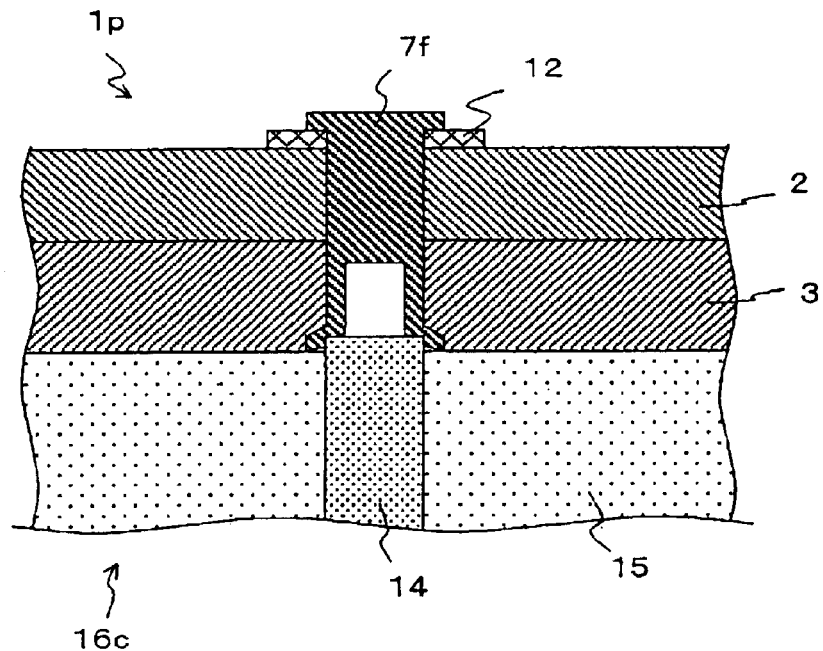
FIGS. 23 to 26 show another example of a manufacturing method of a thermal enhanced type of BGA package in case where a tubular rivet is used for a clamping member.

FIG. 23 shows an example of a manufacturing method of the thermal enhanced type of BGA package including the dam member when the tubular rivet is used for the clamping member. The dam member 12, provided with the through hole, having substantially the same diameter as the outer diameter of cylindrical portion of the tubular rivet 7f at a certain position, is thrust on the guide pin 14 with the plastic circuit board 2 and the heat sink 3, then the sword guard shaped portion of the tubular rivet 7f is depressed to join the plastic circuit board 2, the heat sink 3, and the dam member 12.

At this point, it is preferable to join the plastic circuit board 2 between the heat sink 3 and the dam member 12. The reason for this is that, cracks and defects can be prevented from appearing on the surface of the plastic circuit board 2, since the end of the tubular rivet 7f is not in contact with the surface of the plastic circuit board 2, when the end of the tubular rivet 7f is depressed by the pushing member.

Figure 24:
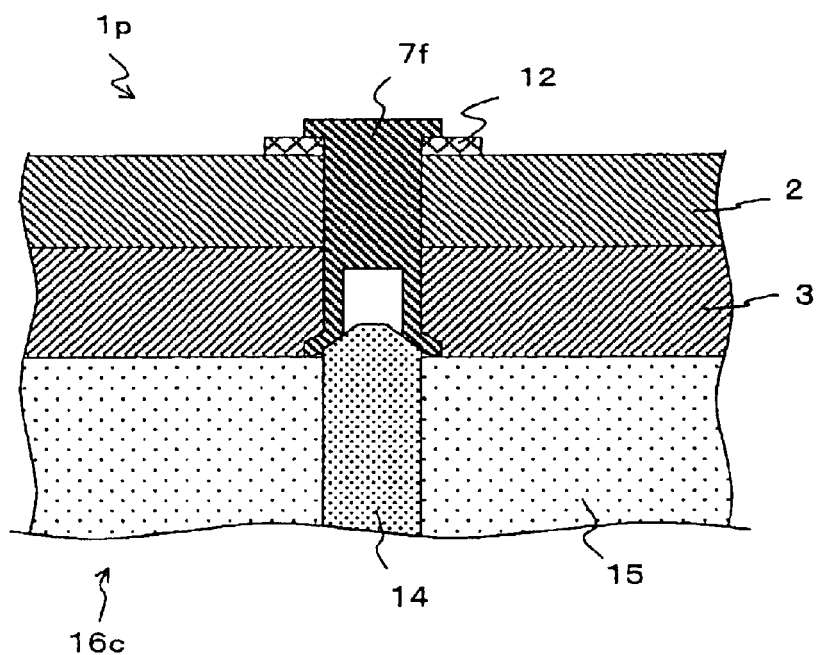

FIG. 24 shows another example of a manufacturing method of the thermal enhanced type of BGA package when the tubular rivet is used for the damping member. As shown in FIG. 24, a guide pin 14, which has a chamfer portion in the upper area, is perpendicularly provided in the alignment jig 16c, and the cylindrical shaped end of the tubular rivet 7f is depressed to expand outward from the central axis, so that the plastic circuit board 2 and the heat sink 3 or the plastic circuit board 2, the heat sink 3 and the dam member 12 may be joined together. Since the guide pin 14 has the chamfer portion shown in FIG. 24, the cylindrical shaped end of the tubular rivet 7f is easily depressed to expand outward, and can be precisely and firmly joined with the tubular rivet.

FIG. 25 shows another example of a manufacturing method of the thermal enhanced type of BGA package when the tubular rivet is used for the clamping member. The cylindrical shaped end of the tubular rivet 7f may be depressed in to a counter bore portion 18, provided in a perimeter portion of the bottom surface of the through hole in the heat sink 3, by cutting or depressing.

This allows the cylindrical shaped end of the tubular rivet 7f to be depressed and fold into the heat sink 3 without difficulty. Since the thermal enhanced type of BGA package 1p, produced by the method described above, can store the end of the tubular rivet 7f without projecting from the bottom portion of the heat sink 3, the flatness of the bottom portion of the heat sink 3 can be maintained and the semiconductor chip (not shown) can be mounted precisely on the thermal enhanced type of BGA package 1p. The heat sink, having the chamfer portion, is not limited to the example shown in FIG. 25, for example, the rivet, the screw, and the eyelet can be also used for the clamping member.

When the plastic circuit board and the heat sink are joined by using the tubular rivet to manufacture the thermal enhanced type of BGA package, the manufacturing method described below may be adopted.

Figure 26:
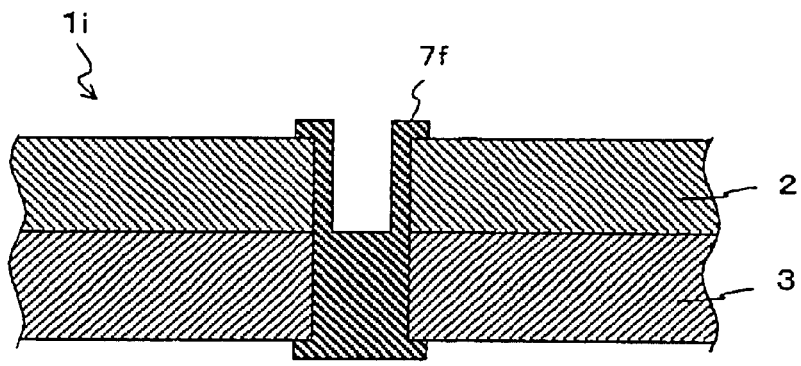
Figure 26:
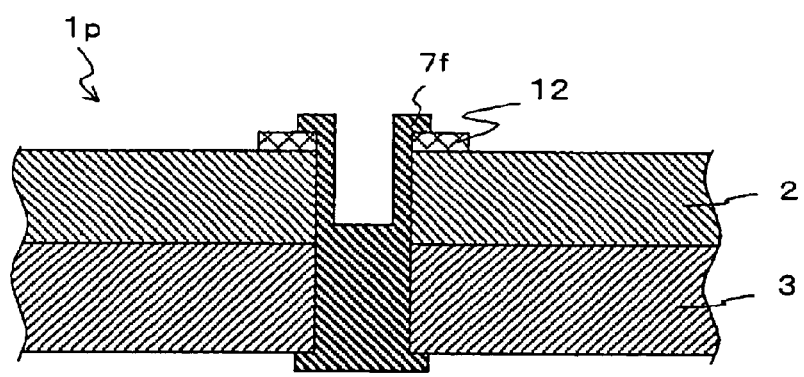
Figure 26:
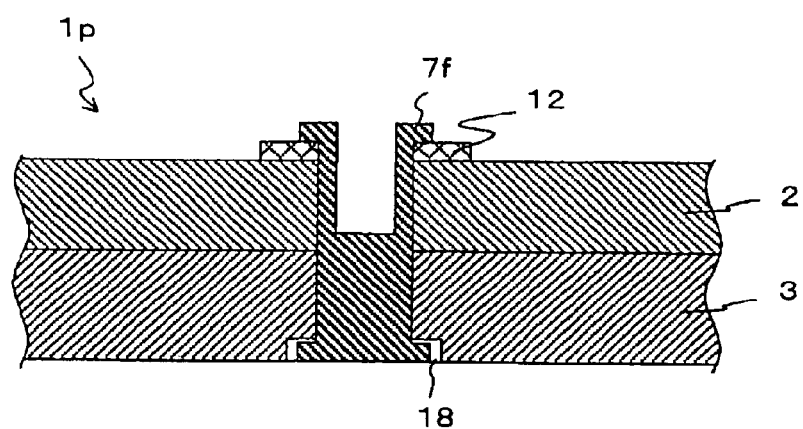

FIG. 26 shows another example of a manufacturing method of the thermal enhanced type of BGA package when the tubular rivet is used for the clamping member. As shown in FIG. 26(a), the cylindrical shaped end of the tubular rivet 7f is inserted from a back side of the heat sink 3 into the through hole in the heat sink 3, and further inserted into the through hole in the plastic circuit board 2 which places the plastic circuit board 2 on the heat sink 3. The cylindrical shaped end of the tubular rivet 7f is depressed by the pushing member, such as a press machine, to expand outward from the central axis. This causes the plastic circuit board 2 and the heat sink 3 to be firmly joined by the cylindrical shaped end and the sword guard portion of the tubular rivet 7f.

As shown in FIG. 26(b), in addition to the plastic circuit board 2 and the heat sink 3, the dam member, having the through hole provided at the substantially same position as the through holes of the plastic circuit board 2 and the heat sink 3, is superimposed, and those members may be joined in a manner that the cylindrical shaped end of the tubular rivet 7f is depressed to expand in the outside direction to the axis. As shown in FIG. 26(c), the counter bore portion 18 is provided in a perimeter portion of the bottom surface of the through hole in the heat sink 3 by cutting and depressing and the sword guard shaped end of the tubular rivet 7f may be placed in the counter bore portion 18.

D. A Manufactiring Method of a Thermal Enhanced Typeof BGA Package According to the Second Invention A manufacturing method of the thermal enhanced type of BGA package according to the second invention will be explained by describing the case where the eyelet is used for the clamping member. The clamping member is not limited to the eyelet. The rivet, the screw, the tubular rivet or a metal pin may be used for the clamping member.

Figure 27:
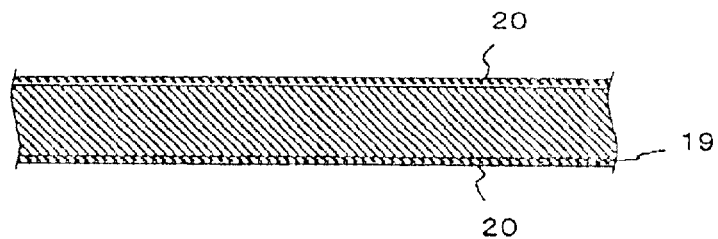
FIG. 27 shows an example of a process in a manufacturing method of a thermal enhanced type of BGA package according to the second invention.
Figure 27:
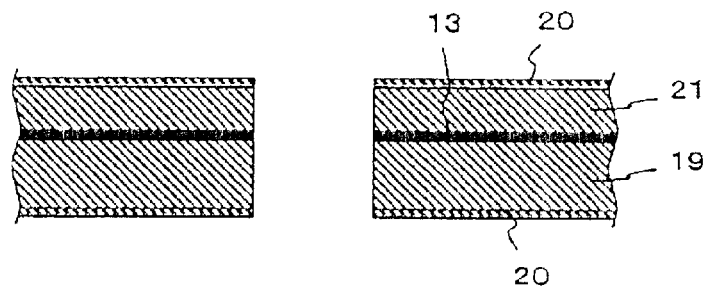
Figure 27:
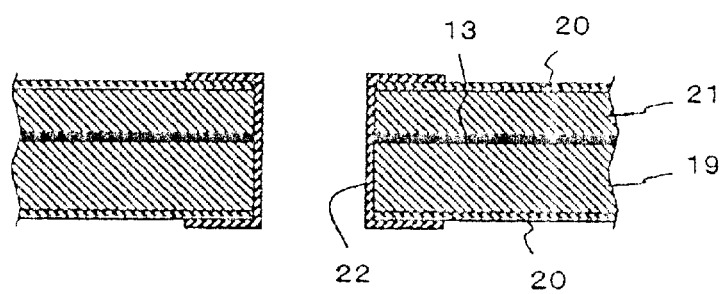
Figure 27:
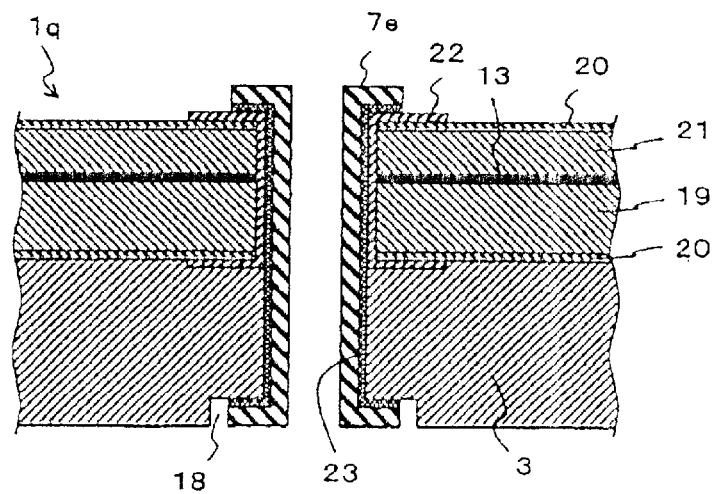

FIG. 27 shows an example of a process in the thermal enhanced type of BGA package, according to the second invention. FIG. 27(a) to FIG. 27(d) show the state of each member in each step respectively. As shown in FIG. 27(a), the plastic circuit board 2 used in the thermal enhanced type of BGA package 1q, according to the second invention, uses a core base material 19 formed by bonding a copper foil 20 to a surface of a resin such as BT resin (a resin containing mainly bismaleimide triazine) or an epoxy resin, which have good heat resistance, dielectric properties, insulating characteristics, and workability as the base material. Lead patterns for a signal and grounds as an inner packaging are formed on both surfaces or on one surface of the copper foil 20 by a photolithographic method or etching. For example, a lead pattern for the grounds in the lead patterns is used for the circuit pattern 13 provided in the plastic circuit board.

As shown in FIG. 27(b), a prepreg 21, in a shape of a sheet is adhered to both surfaces or to one surface of the core base material 19, and the copper foil 20 is further superimposed to form a multi-layer by thermo-compression bonding, then the through hole for inserting the eyelet 7e and an electrical through hole (not shown), for forming an electrical contact of the lead patterns, between an upper layer and a lower layer are formed by using a drilling machine or a laser machine.

As shown in FIG. 27(c), the through hole of the plastic circuit board, the wall surface of a resin of the electrical thorough hole (not shown), and the surface of the copper foil 20 are all applied as a catalyst, such as palladium, are carried out the electro-less plating by being put into a strong alkali bathe with the hormalin as a reducing agent. After this is accomplished they are carried out copper electroplating in a plating bath such as copper sulfate or pyrophosphoric acid in order to form a copper plating film 22. The copper plating film 22 is formed for an inner layer, and it is connected electrically to the circuit pattern 13, whose end is exposed to the wall surface of the through hole when the through hole of the plastic circuit board 2 is formed.

On the both of the surfaces where the copper foil 20 and the copper plating film 22 are formed, lead patterns such as a rim portion pattern (not shown), which is provided in the rim portion of the upper and lower surfaces of the through hole in the plastic circuit board 2, and disconnected to all other lead patterns formed on the both surfaces, a pad for connecting the solder ball (not shown), and a connecting pad for wire-bonding (not shown) are formed by the photolithographic method or by etching. The solder resist film (not shown) is formed by exposing the required part of the leads pattern form to an aperture, Ni plating and Au plating are carried out to the lead patterns, which need the plating film of the pad for connecting the solder ball or bonding wire to produce the plastic circuit board 2.

The heat sink, joined to the plastic circuit board 2, is made from a metal plate, for example, such as a copper plate and a copper alloy plate, having excellent property of heat dispersion, the anti-oxidizing by Ni plating treatment (anti-oxidation treatment) is applied to the opposite surface from a surface joined to the plastic circuit board 2. On the other hand, it is preferable that an oxide copper layer is formed on the surface joined to the plastic circuit board 2 by a chemical treatment, such as black oxidation, in order to increase adhesiveness to an Ag paste used for joining the bottom portion of the cavity and the semiconductor chip or the sealing resin. Then, in the heat sink 3, the through hole for inserting the eyelet 7e is formed at the substantially same position as the through hole formed in the plastic circuit board 2, by a drilling machine, in order to be substantially the same diameter as the diameter of the through hole after the copper plating film 22 is finished. In the heat sink 3, it is preferable that the counter bore portion is formed by cutting the opposite surface from the surface joined to the plastic circuit board 2, in order to store the sword guard shaped end or the expanded cylindrical end of the eyelet 7e, during joining.

It is preferable that the eyelet 7e is made of a metal having good corrosion resistance, such as a copper alloy or stainless steel, and one end of the eyelet 7e is in a shape of the sword guard. Solder 23 is fixed the outer surface of the eyelet 7e in a manner that the eyelet 7e is dipped in a melted solder bath, and lifted from the bath to be cooled. In the example shown in FIG. 27(d), though the solder exists only in an outer surface side of the eyelet 7e, the solder 23 is also allowed to exist in the inner surface of the eyelet 7e.

As described above, the metal pin such as the rivet, the screw, or the tubular rivet may be used instead of the eyelet. In case the metal pin is used, the metal pin whose outer surface is fixed by the solder.

As shown in FIG. 27(d), the heat sink 3 and the plastic circuit board 2, which are formed by the above-described manufacturing method, are superimposed, the eyelet 7e coated by the solder 23 is inserted in the through holes provided in the heat sink 3 and the plastic circuit board 2. In case the eyelet 7e, whose one end is in the shape of sword guard is used, the other end is depressed to expand in the outside direction to the axis to form mechanically to the joint body including the plastic circuit board 2 and the heat sink 3. On the other hand, in case the eyelet 7e, whose one end is not in the shape of sword guard is used, both ends are depressed to expand in the outside direction to the axis to form mechanically to the joint body including the plastic circuit board 2 and the heat sink 3.

As shown in FIG. 27(d), it is also preferable that the counter bore portion 18 is provided by cutting or depressing in perimeter portion of the bottom surface side of the through hole in the heat sink 3, the sword guard shaped end or the expanded cylindrical end of the eyelet 7e is placed in the counter bore portion 18. The heat sink 3 having the counter bore portion 18, can prevent the package itself from slanting when the semiconductor chip (not shown) is mounted, and can attach cooling fins easily.

Then, by overheating the joint body, the solder 23 coated eyelet 7e is melted, the heat sink 3 and the plastic circuit board 2 are joined by the eyelet 7e through the solder 23. At this point, the heat sink 3 is electrically connected to the circuit pattern 13 as a part of the lead patterns provided in the plastic circuit board 2 through the copper plating 22, the solder 23, and the eyelet 7e.

This permits the plastic circuit board 2 and the heat sink 3 to be joined easily and firmly. Since the heat sink 3 is easily connected to a part of the circuit pattern 13 of the plastic circuit board 2, by using the eyelet 7e, the thermal enhanced type of BGA package 1q, can be produced without the high-frequency noise from the heat sink 3.

Figure 28:
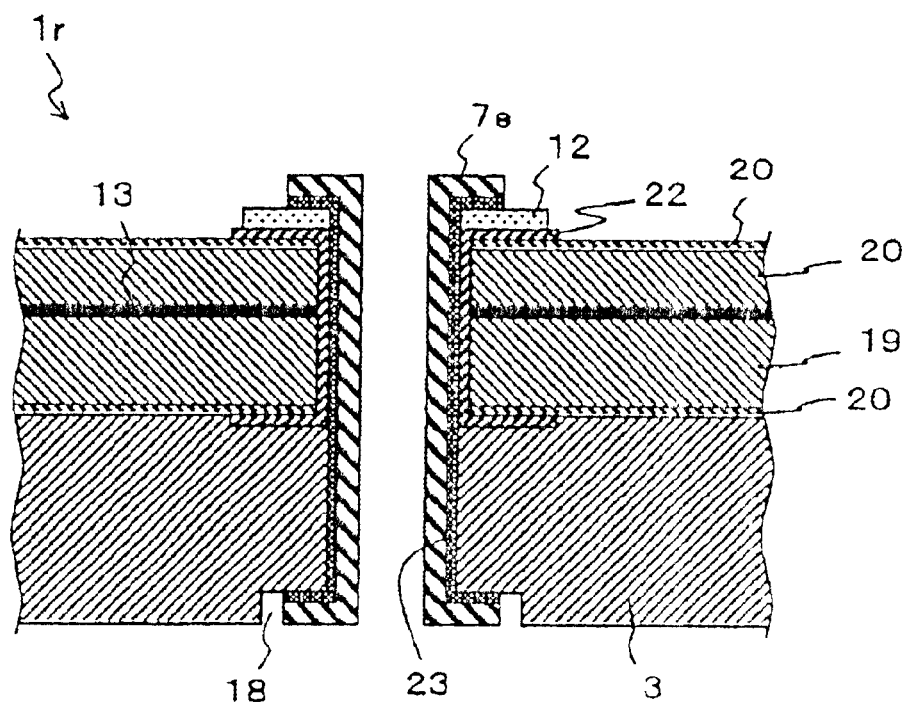
FIG. 28 shows an example of a thermal enhanced type of BGA package which is manufactured by another manufacturing method of a thermal enhanced type of BGA package according to the second invention.

FIG. 28 shows an example of a thermal enhanced type of BGA package manufactured by another method of according to the second invention. The plastic circuit board 2 and the heat sink 3, used in the manufacturing method explained below, may be produced by the same manufacturing method described above.

As shown in FIG. 28, in the thermal enhanced type of BGA package 1r, produced by the same manufacturing method, the dam member 12 is joined to the plastic circuit board 2 and the heat sink 3 by the eyelet 7e. The dam member 12 is made from a metal plate, having good corrosion resistance such as a copper alloy or stainless steel, and formed in a shape of ring. In the dam member 12, the through hole for inserting the eyelet 7e is formed at substantially the same position as the through hole formed in the plastic circuit board 2 in order to be substantially the same diameter as the diameter of the through hole after the through hole is coated by the copper plating film 22.

After the heat sink 3 and the plastic circuit board 2 are superimposed, the dam member 12 is placed on the upper surface of the plastic circuit board 2, the eyelet 7e, coated by the solder 23, is inserted into the through holes in each member. In case the eyelet 7e, whose one end is in the shape of sword guard is used, the other end is depressed to expand in the outside direction to the axis to form mechanically to the joint body including the plastic circuit board 2, the heat sink 3 and the dam member 12. On the other hand, In case the eyelet 7e, whose one end is not in the shape of sword guard, is used, both ends are depressed to expand in the outside direction to the axis to form mechanically to the joint body, including the plastic circuit board 2, the heat sink 3, and the dam member 12.

Then, by overheating the joint body, the solder 23 coated to the eyelet 7e is melted, and the plastic circuit board 2, the heat sink 3 and the dam member 12 are joined by the eyelet 7e through the solder 23. At this point, the heat sink 3 and the dam member 12 are electrically connected to the circuit pattern which is a part of the lead patterns provided in the plastic circuit board 2, through the copper plating 22, the solder 23, and the eyelet 7e.

This permits the thermal enhanced type of BGA package 1r, to be produced without the high-frequency noise from neither the heat sink 3 nor from the dam member 12.

As described above, in the thermal enhanced type of BGA package, according to the first invention, the bonding agent prepreg is not used, so the problem caused by using it does not take place and when the plastic circuit board and the heat sink are joined mechanically, sufficient bonding strength is obtained between the plastic circuit board and the heat sink. In case the solder resist film which is charged in the through hole, provided in the plastic circuit board, is formed, moisture, taken into the resin material or the bonding agent, is discharged from the small gap between the plastic circuit board and the heat sink, so that the popcorn phenomenon from heating of the reflow soldering does not take place, therefore the problem of destruction of the thermal enhanced type of BGA package does not take place.

Particularly, in the thermal enhanced type of BGA package, in which the eyelet or the tubular rivet is used for the damping member, the problem which, the processing time is excessive by using the caulking member, the rivet, or the screw as the clamping member, does not take place. Excessive press pressure, such as the normal rivet, is not required when the end of the eyelet or the tubular rivet is folded, therefore there are no defect in the plastic circuit board and the crack in the solder resist film such as the clamping with the screw and the nut do not take place.

In the thermal enhanced type of BGA package, in which the dam member in the shape of ring is further used, the overflow of the sealing resin for sealing the semiconductor chip in the thermal enhanced type of BGA package can be prevented. When the metal ring such as the rivet is joined, the cracks and the defects in the plastic circuit board can also be prevented.

The thermal enhanced type of BGA package, according to the second invention, can be firmly joined to the plastic circuit board and the heat sink or to the plastic circuit board, the heat sink, and the dam member. The heat sink or the heat sink and the dam member are electrically connected to part of the circuit pattern provided in the plastic circuit board, therefore the high-frequency noise from these members can be prevented.

Particularly, when the clamping member such as the rivet is used and the clamping member whose cylindrical portion is coated by solder, the plastic circuit board and the heat sink or the plastic circuit board, the heat sink and the dam member are joined more firmly, and the electrical connection is maintained, the high-frequency noise from the heat sink or the heat sink and the dam member can definitely be prevent.

What is claimed is:

1. A thermal enhanced type of BGA package, in which a metal heat sink is joined to one side of a plastic circuit board which has a cutout space in the central portion, comprised of a clamping member joining the plastic circuit board and the heat sink, in which at least one of the clamping members is an eyelet and/or a tublar rivet, and the eyelet and/or the tublar rivet is not integrally molded.

2. A thermal enhanced type of BGA package, as claimed in claim 1, which is comprised of a dam member attached by the clamping member.

3. A thermal enhanced type of BGA package, as claimed in claim 2, in which the dam member has one or more through holes for inserting the eyelet and/or the tublar rivet.

4. A thermal enhanced type of BGA package, as claimed in claim 2, which is comprised of a counter bore portion, provided a bottom side of the through hole in the heat sink, which has a larger diameter than the diameter of the thorough hole.

5. A thermal enhanced type of BGA package, as claimed in claim 3, which is comprised of a counter bore portion, provided a bottom side of the through hole in the heat sink, which has a larger diameter than the diameter of the thorough hole.

6. A thermal enhanced type of BGA package, as claimed in claim 1, in which a circuit pattern is provided in the plastic circuit board, and the heat sink is electrically connected to a part of the circuit pattern by the clamping member.

7. A thermal enhanced type of BGA package, as claimed in claim 6, comprised of a dam member attached by the clamping member and electrically connecting the dam member and the heat sink to a part of the circuit pattern by the clamping member.

8. A thermal enhanced type of BGA package, as claimed in claim 7, wherein the dam member having one or more through holes for inserting the eyelet and/or the tublar rivet.

9. A thermal enhanced type of BGA package, as claimed in claim 8, in which the clamping member is joined to the plastic circuit board, the heat sink and the dam member by solder.

10. A thermal enhanced type of BGA package, as claimed in claim 9, which is comprised of a counter bore portion, provided a bottom side of the through hole in the heat sink, which has a larger diameter than the diameter of the thorough hole.

11. A thermal enhanced type of BGA package, as claimed in claim 8, which is comprised of a counter bore portion, provided a bottom side of the through hole in the heat sink, which has a larger diameter than the diameter of the through hole.

12. A thermal enhanced type of BGA package, as claimed in claim 7, in which the clamping member is joined to the plastic circuit board, the heat sink, and the dam member by solder.

13. A thermal enhanced type of BGA package, as claimed in claim 12, which is comprised of a counter bore portion, provided a bottom side of the through hole in the heat sink, which has a larger diameter than the diameter of the thorough hole.

14. A thermal enhanced type of BGA package, as claimed in claim 7, which is comprised of a counter bore portion, provided a bottom side of the through hole in the heat sink, which has a larger diameter than the diameter of the thorough hole.

15. A thermal enhanced type of BGA package, as claimed in claim 6, wherein the clamping member is joined to the plastic circuit board and the heat sink by solder.

16. A thermal enhanced type of BGA package, as claimed in claim 15, which is comprised of a counter bore portion, provided a bottom side of the through hole in the heat sink, which has a larger diameter than the diameter of the thorough hole.

17. A thermal enhanced type of BGA package, as claimed in claim 6, which is comprised of a counter bore portion, provided a bottom side of the through hole in the heat sink, which has a larger diameter than the diameter of the thorough hole.

18. A thermal enhanced type of BGA package, as claimed in claim 1, which is comprised of a counter bore portion, provided a bottom side of the through hole in the heat sink, which has a larger diameter than the diameter of the thorough hole.

19. A semiconductor device in which a semiconductor chip is mounted on the thermal enhanced type of BGA package as claimed in any one of claims 1, 2–9, or 18–10.

* * * * *